United States Patent [19]

Hasegawa et al.

[11] Patent Number: 5,467,303
[45] Date of Patent: Nov. 14, 1995

[54] SEMICONDUCTOR MEMORY DEVICE HAVING REGISTER GROUPS FOR WRITING AND READING DATA

[75] Inventors: Takehiro Hasegawa, Tokyo; Shigeyoshi Watanabe; Fujio Masuoka, both of Yokohama, all of Japan

[73] Assignee: Kabushiki Kaisha Toshiba, Kawasaki, Japan

[21] Appl. No.: 380,443

[22] Filed: Jan. 30, 1995

Related U.S. Application Data

[63] Continuation of Ser. No. 99,593, Jul. 30, 1993, abandoned.

[30] Foreign Application Priority Data

Jul. 31, 1992 [JP] Japan .................................... 4-205685

[51] Int. Cl.⁶ .............................. G11C 11/24; G11C 7/00
[52] U.S. Cl. ...................... 365/149; 365/189.12; 365/240
[58] Field of Search ......................... 365/149, 78, 189.12, 365/240

[56] References Cited

U.S. PATENT DOCUMENTS

| | | | |
|---|---|---|---|
| 4,648,073 | 3/1987 | Kenney | 365/149 |
| 4,733,376 | 3/1988 | Ogawa | 365/240 |
| 4,985,868 | 1/1991 | Nakano et al. | 365/222 |
| 5,170,157 | 12/1992 | Ishii | 365/189.12 X |

FOREIGN PATENT DOCUMENTS

0481942A2  4/1992  European Pat. Off. ................. 365/78

OTHER PUBLICATIONS

IEEE Journal of Solid-State Circuits, vol. 26, No. 11, Nov. 1991, pp. 1511–1518, A Block-Oriented Ram with Half-Sized Dram Cell and Quasi-Folded Data-Line Architecture.

1991 IEEE International Solid-State Circuits Conference Digest of Technical Papers, No. 134, pp. 106, 107 & 297, K. Kimura, et al., "Tan 6.2: A Block-Oriented Ram with Half-Sized Dram Cell and Quasi-Folded Data-Line Architecture".

*Primary Examiner*—David C. Nelms
*Assistant Examiner*—Son Dinh
*Attorney, Agent, or Firm*—Oblon, Spivak, McClelland, Maier & Neustadt

[57] ABSTRACT

A semiconductor memory device comprises an array of memory cell units, each of which has a plurality of MOS transistors connected in series and a plurality of information storage capacitors corresponding in number to the MOS transistors and each having its one end connected to the source of a corresponding one of the MOS transistors, and a plurality of register groups each of which is adapted to temporarily store information stored in one of the memory cell units for each column of the array in order to read from and write into each memory cell unit.

18 Claims, 26 Drawing Sheets

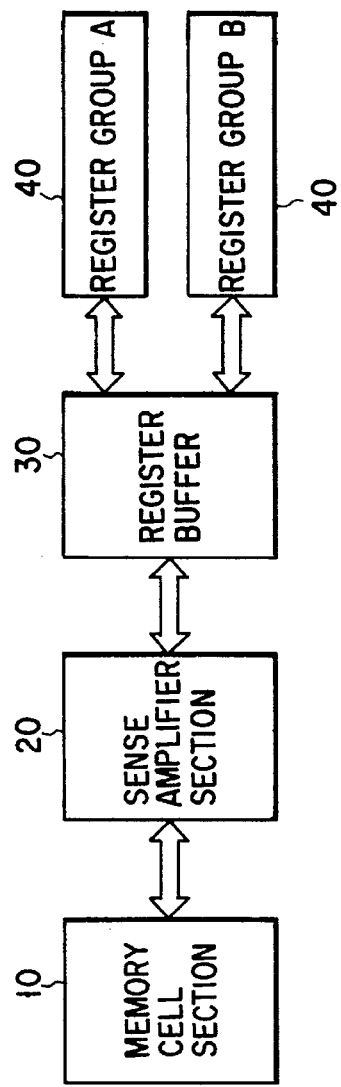
FIG. 1
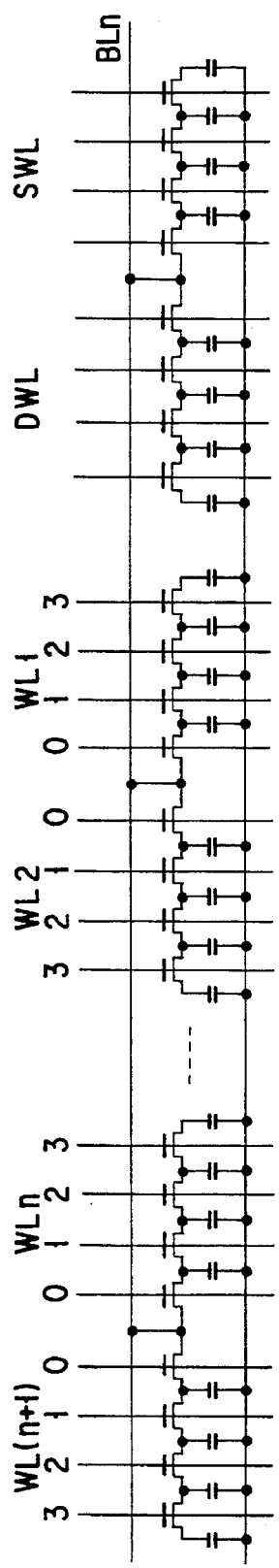
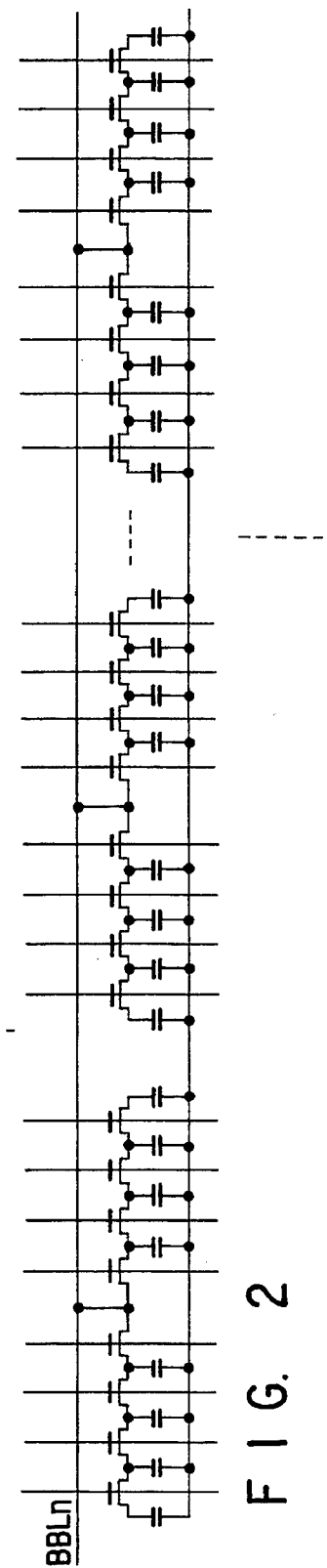
FIG. 2

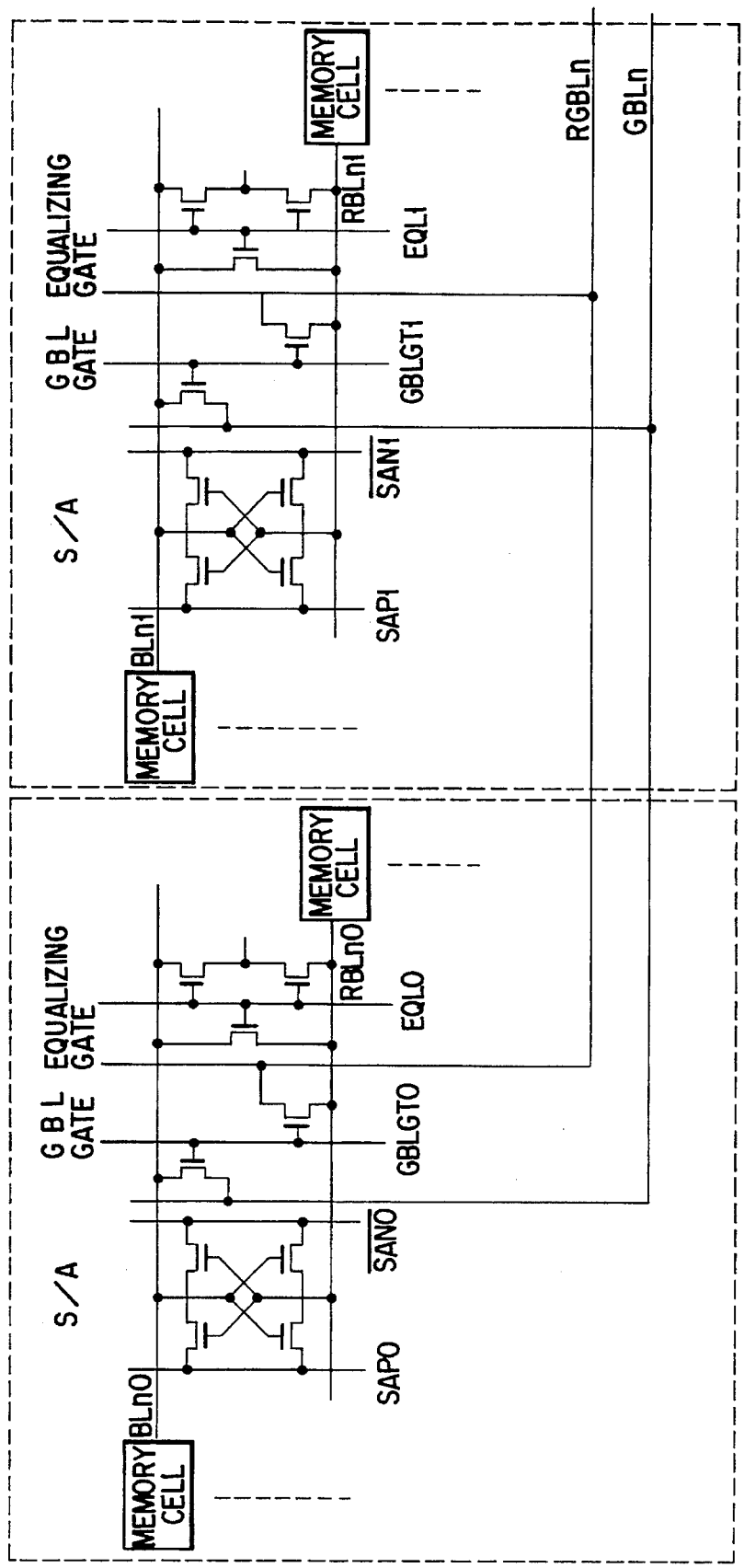
F I G. 6

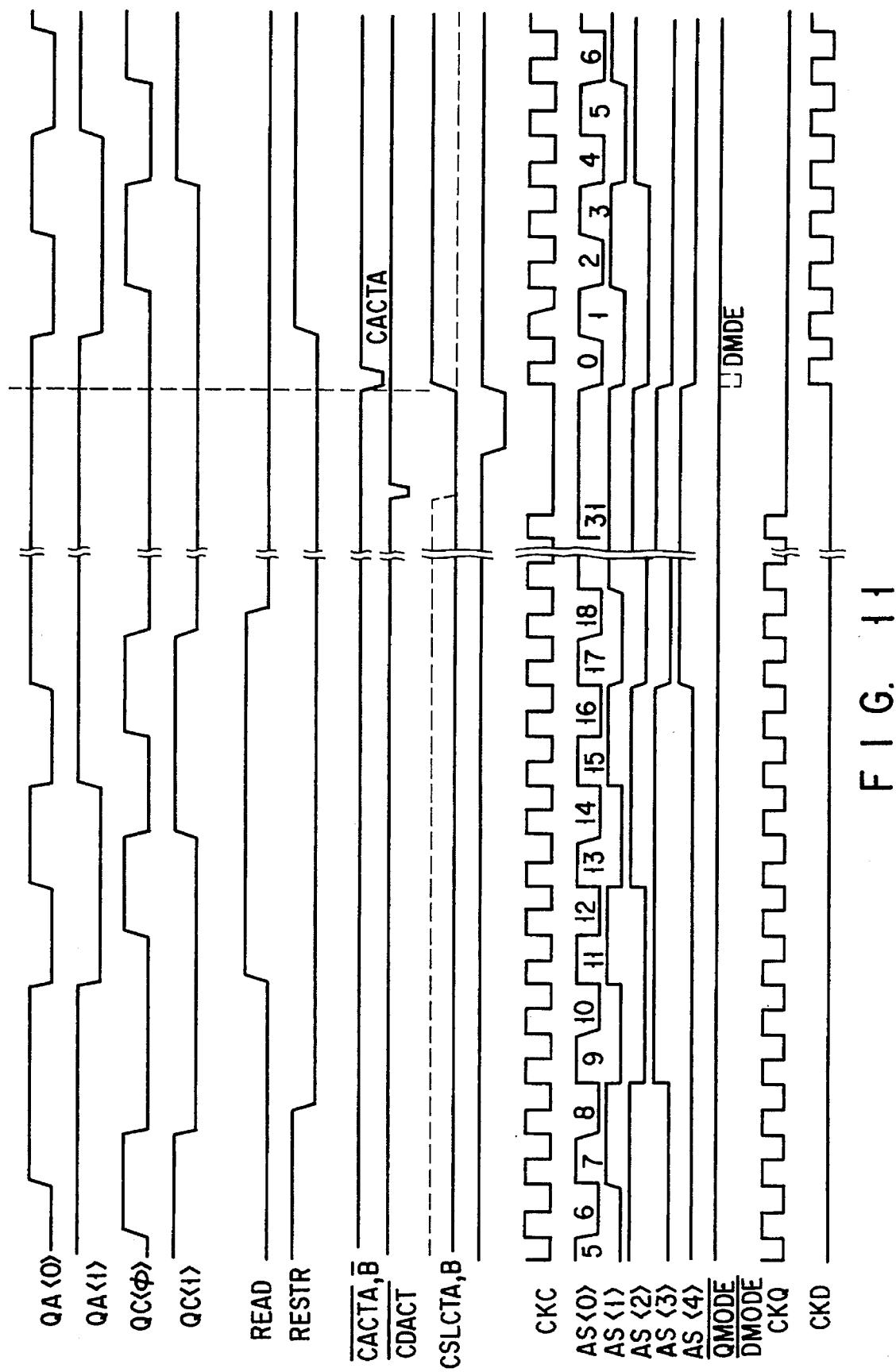
F I G. 11

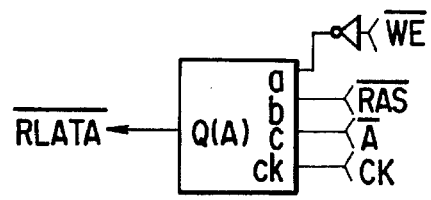
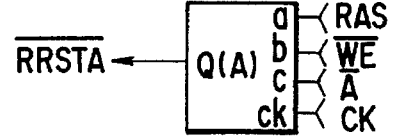
LATCH OF ROW ADDRESS
RESTORE START SIGNAL
F I G. 12A
F I G. 12B
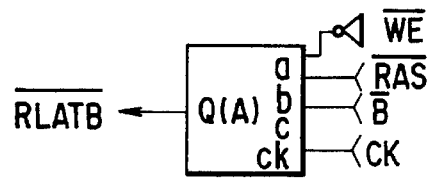
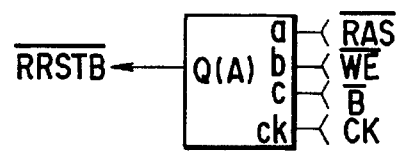
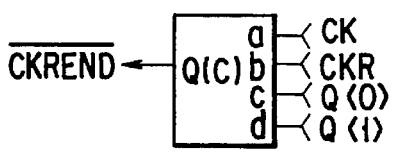
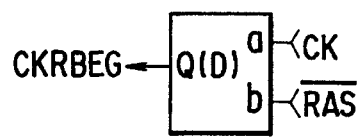
END OF CKR
START OF CKR
F I G. 12C
F I G. 12D
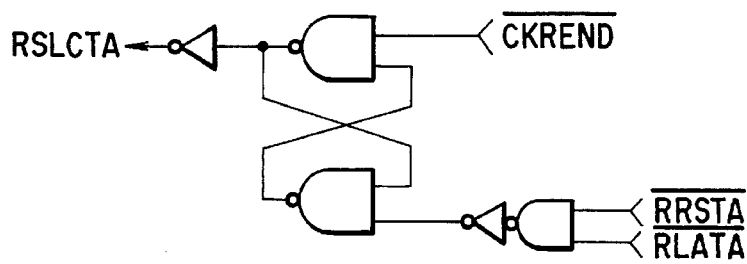
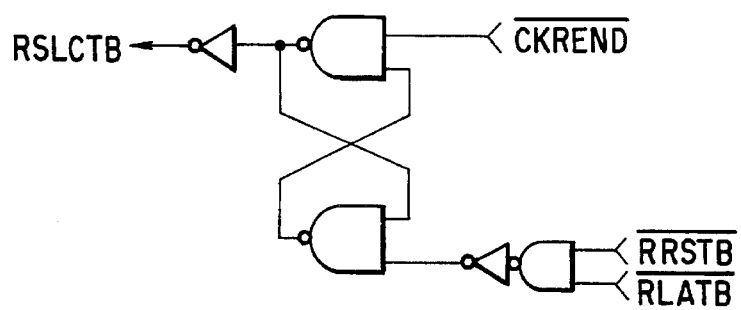
ROW ADDRESS SELECT SIGNAL
F I G. 12E

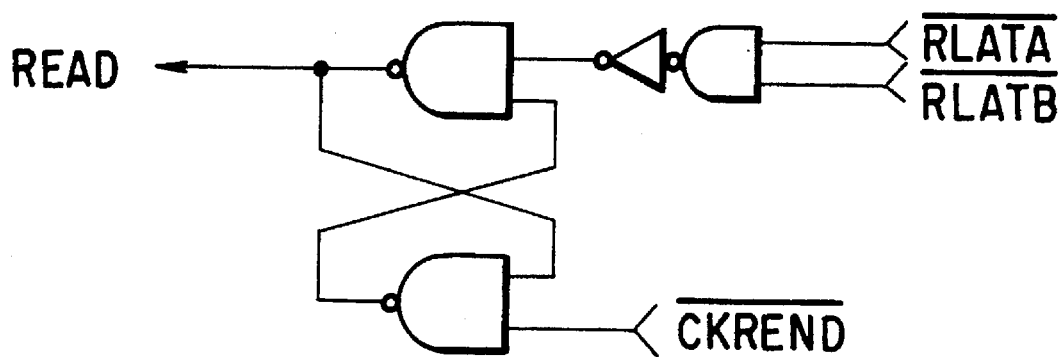
READ CYCLE CONTROL SIGNAL
F I G. 13A
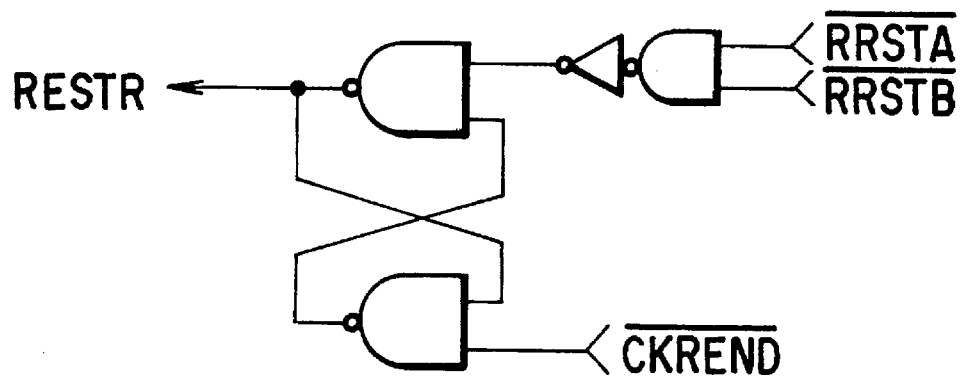
RESTORE CYCLE CONTROL SIGNAL
F I G. 13B

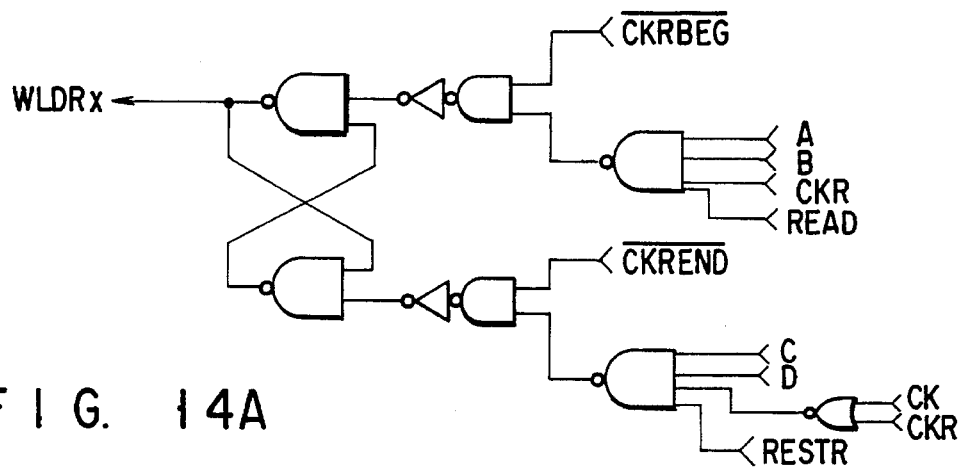
FIG. 14A
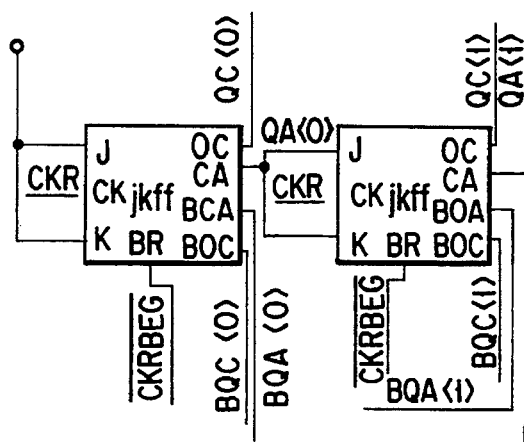
FIG. 14B
| WLDRx | WLDRφ | 1 | 2 | 3 |
|---|---|---|---|---|
| A | BQC⟨φ⟩ | QC⟨φ⟩ | BQC⟨0⟩ | QC⟨0⟩ |
| B | BQC⟨1⟩ | BQC⟨1⟩ | QC⟨1⟩ | QC⟨1⟩ |
| C | QA⟨0⟩ | BQA⟨0⟩ | QN⟨0⟩ | BQA⟨0⟩ |
| D | QA⟨1⟩ | QA⟨1⟩ | BQA⟨1⟩ | BQA⟨1⟩ |
FIG. 14C
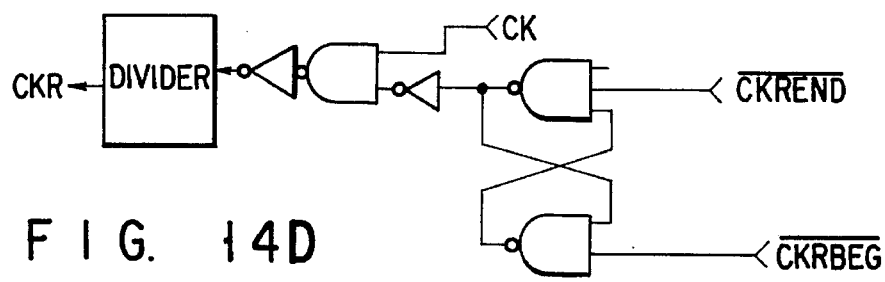
FIG. 14D

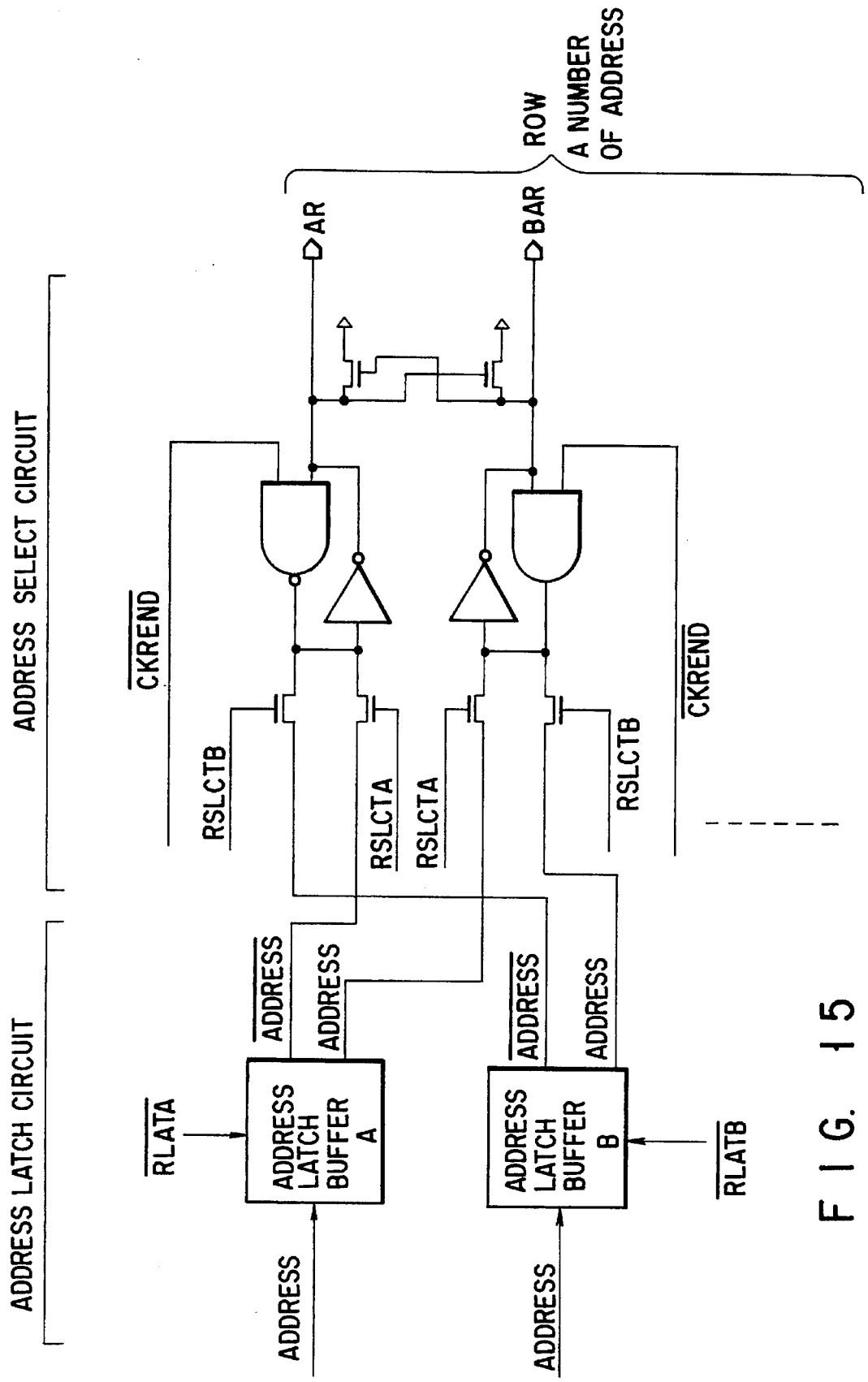
F I G. 15

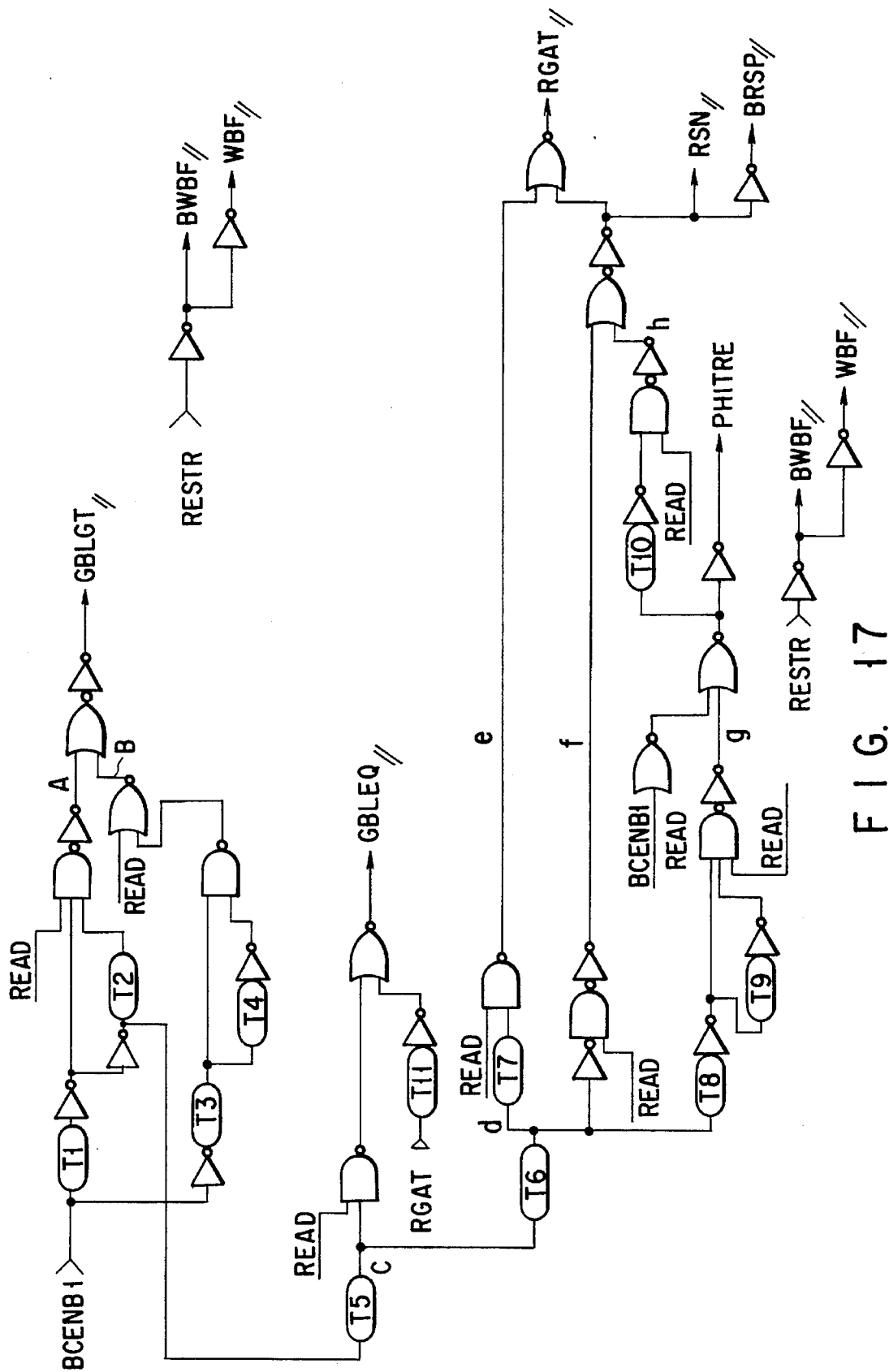
F I G. 17

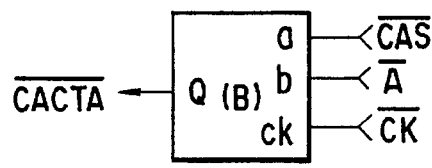
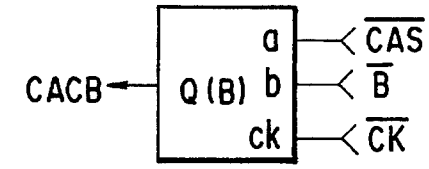
FIG. 21A
COLUMN OPERATION START SIGNAL
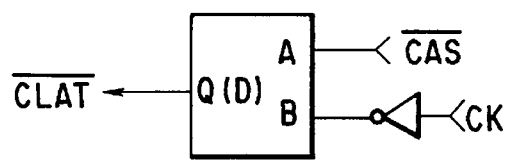
FIG. 21B
COLUMN ADDRESS LATCH SIGNAL CIRCUIT
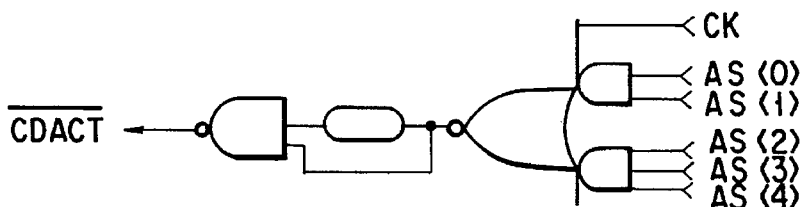
FIG. 21C
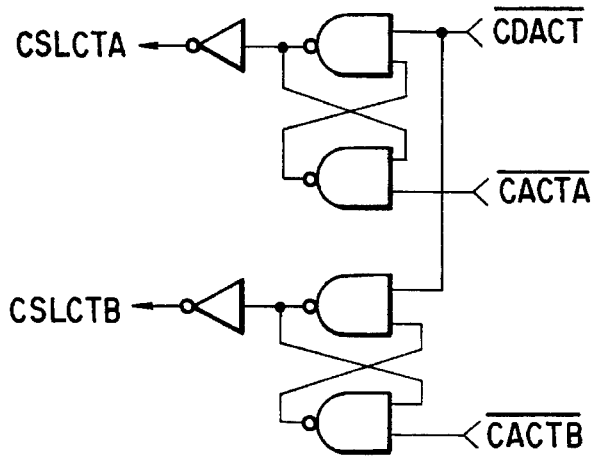
FIG. 21D
COLUMN OPERATION PERIOD SIGNAL CIRCUIT

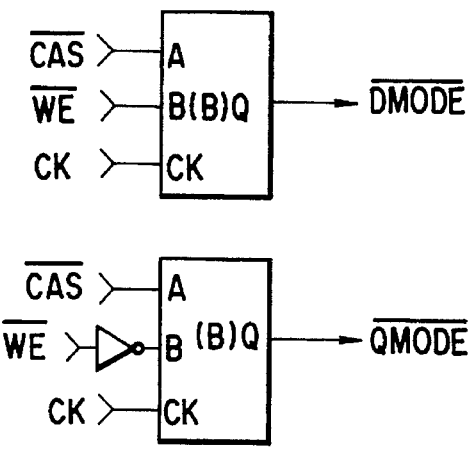
F I G. 25A
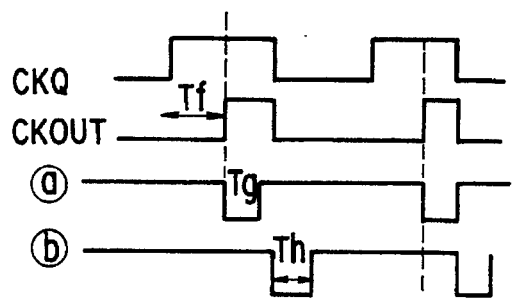
F I G. 25C
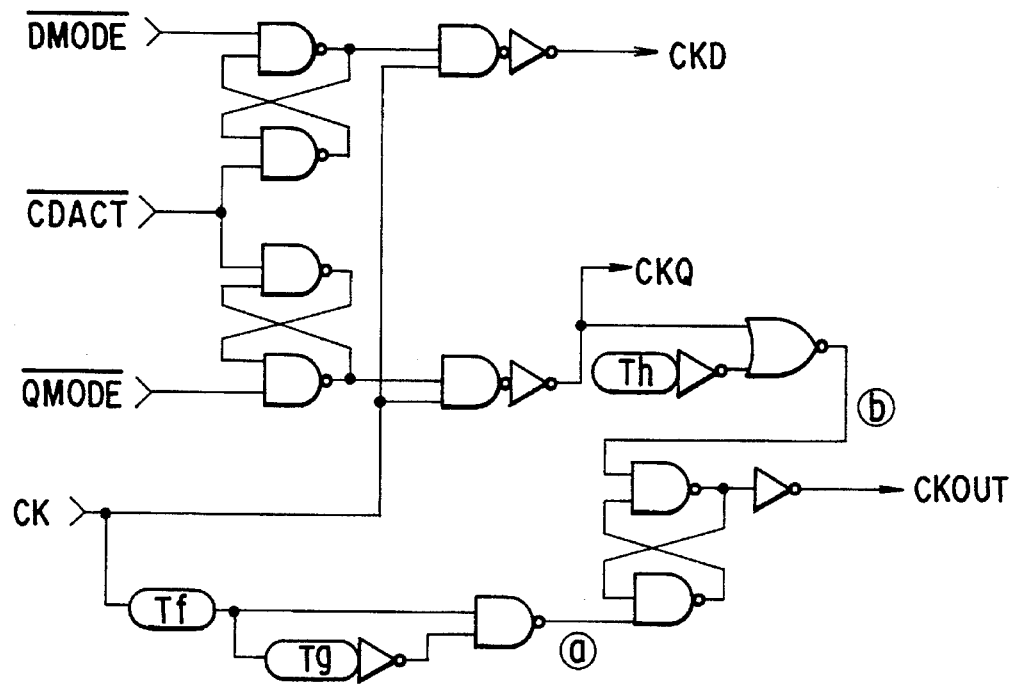
F I G. 25B

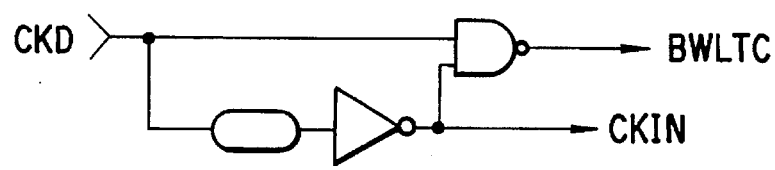
F I G. 26A
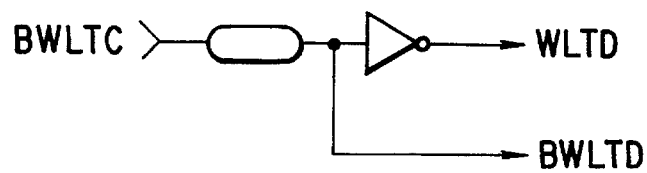
F I G. 26B
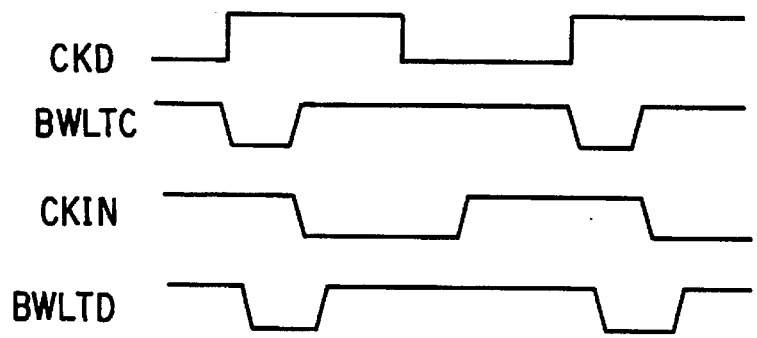
F I G. 26C

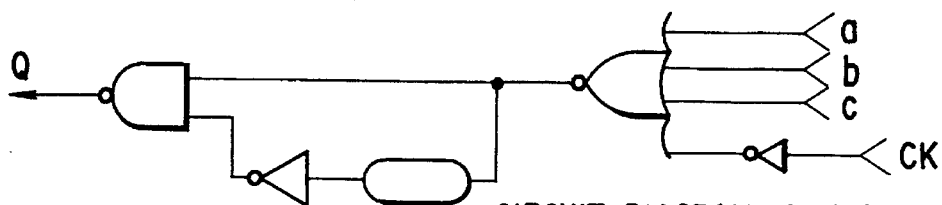
CIRCUIT DIAGRAM OF (A) CONTENT
F I G. 28A
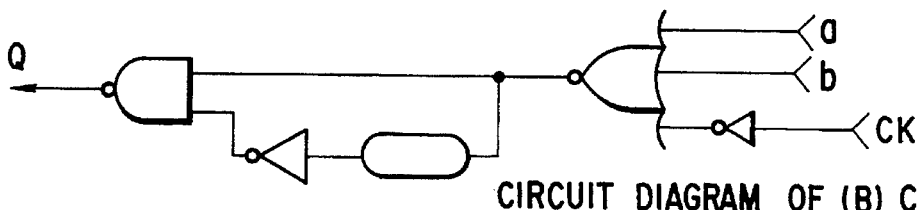
CIRCUIT DIAGRAM OF (B) CONTENT
F I G. 28B
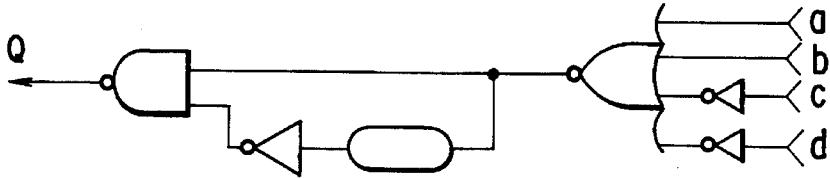
CIRCUIT DIAGRAM OF (C) CONTENT
F I G. 28C
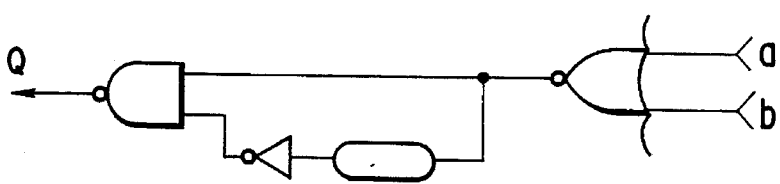
CIRCUIT DIAGRAM OF (D) CONTENT
F I G. 28D

SEMICONDUCTOR MEMORY DEVICE HAVING REGISTER GROUPS FOR WRITING AND READING DATA This application is a Continuation of application Ser. No. 08/099,593, filed on Jul. 30, 1993, now abandoned.

BACKGROUND OF THE INVENTION

1. Field of the Invention

The present invention relates to a semiconductor memory device, and more particularly to a system configuration of a semiconductor memory device having an array of dynamic memory cell units each of which is a NAND type structure or has a plurality of MOS transistors connected in series and a plurality of information storage capacitors each connected at its one end to the source of a respective one of the MOS transistors.

2. Description of the Related Art

As a type of dynamic random access memory (DRAM) a system has been developed recently in which a plurality of memory cells are connected in series to form a memory cell unit (a NAND type of memory cell unit), and such memory cell units are arrayed. It is an advantage of this cell array scheme is that there are few bit-line-to-cell contacts and hence the area of each cell can be decreased.

With this type of DRAM, for reading and rewriting of data, data stored in memory cells of each memory cell unit is read out in time sequence and then held temporarily in predetermined registers. The read data must be rewritten into the DRAM in time sequence. Thus, it takes long time to read and rewrite data. In addition, another read operation is not allowed during this data reading and rewriting operation. Thus much time is wasted.

As described above, problems with the conventional semiconductor memory device having an array of NAND type DRAM memory cell units are that a data reading and rewriting operation needs a long time, and no access to other data is allowed during that data reading and rewriting operation.

SUMMARY OF THE INVENTION

It is an object of the present invention to provide a semiconductor memory device which permits a time required to read and rewrite data to be eliminated apparently and the data access time to be reduced accordingly.

The main feature of the present invention lies in the provision of, as means for temporarily storing cell data, a plurality of register groups each having as many bits as there are cells in a memory cell unit and the use of the register groups in parallel.

The present invention is characterized by a semiconductor memory device comprising:

at least one memory cell array having a plurality of memory cell units each comprising a plurality of MOS transistors connected in series and a plurality of information storage capacitors corresponding in number to the MOS transistors and each connected at its one end to the source of a corresponding one of the MOS transistors; and register groups each of which temporarily stores stored information in a single memory cell unit for each column of the array in order to read from and write into each of the memory cell units.

The present invention is further characterized in that each of the memory cell units is a NAND type structure.

The present invention can preferably be embodied as follows:

(1) Each of the register groups is constructed from static memory cells.

(2) A number n of address latch circuits are provided for each address bit.

(3) The address latch circuits in (2) latch a row address.

(4) A control circuit for word lines of the memory cell units has a counter.

(5) An address select circuit is provided which selects one of outputs of the n address latch circuits in (2) and (3).

(6) At least part of the register groups is shared among a plurality of memory cell arrays.

According to the present invention, at the time of a shift from access to a row to access to the next row, while data read from a memory cell unit into a register group is accessed from outside, data can be read from another memory cell unit into another register group and data can be rewritten into that memory cell unit. Therefore, it becomes possible to apparently eliminate a register-to-memory-cell data transfer operation which was considered to be waste of time when seen from outside, permitting the data access time to be shortened.

According to the present invention, by providing a plurality of register groups each having as many bits as there are memory cells in each memory cell unit and using the register groups in parallel, the time required by a data read and rewrite operation can be eliminated apparently, which shortens the data access time.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a basic block diagram of a semiconductor memory device according to an embodiment of the present invention;

FIG. 2 shows a specific arrangement of the memory cell section of FIG. 1;

FIG. 6 shows an embodiment in which the register group is shared among a plurality of memory cell arrays;

FIG. 11 shows signal waveforms of main clocks when the system of FIG. 7 is operated;

FIGS. 12A to 12E show specific arrangements of the row control circuit of FIG. 7;

FIGS. 13A and 13B shows a specific arrangement of the row control circuit of FIG. 7;

FIGS. 14A to 14D show a specific arrangement of the word line control circuit of FIG. 7;

FIG. 15 shows a specific arrangement of the row address buffer of FIG. 7;

FIG. 17 shows a specific arrangement of the data transfer control circuit of FIG. 7;

FIG. 21A to 21D show a specific arrangement of the column control circuit of FIG. 7;

FIGS. 25A to 25C show a specific arrangement of the I/O buffer control circuit of FIG. 7;

FIGS. 26A to 26C show a specific arrangement of the I/O control circuit of FIG. 7;

FIGS. 28A to 28D show various specific arrangements of a basic pulse generating circuit used in the present embodiment of the present invention.

DETAILED DESCRIPTION OF THE PREFERRED EMBODIMENTS

Referring now to FIG. 1 there is shown a basic block diagram of a semiconductor memory device according to an embodiment of the present invention.

The semiconductor memory device has an array of NAND type dynamic memory cell units each of which comprises a memory cell section 10, a sense amplifier section 20, a register buffer, and register groups 40.

Specific arrangements of the respective sections in the memory cell unit are shown in FIGS. 2 to 5. Specifically, FIGS. 2 to 5 show specific arrangements of the memory cell section 10, the sense amplifier section 20, the register buffer 30, and the register groups 40, respectively.

In the present embodiment, each memory cell unit is composed of four memory cells, each of which is composed of four series-connected MOS transistors each having its source connected to an information storage capacitor.

Figure 3:
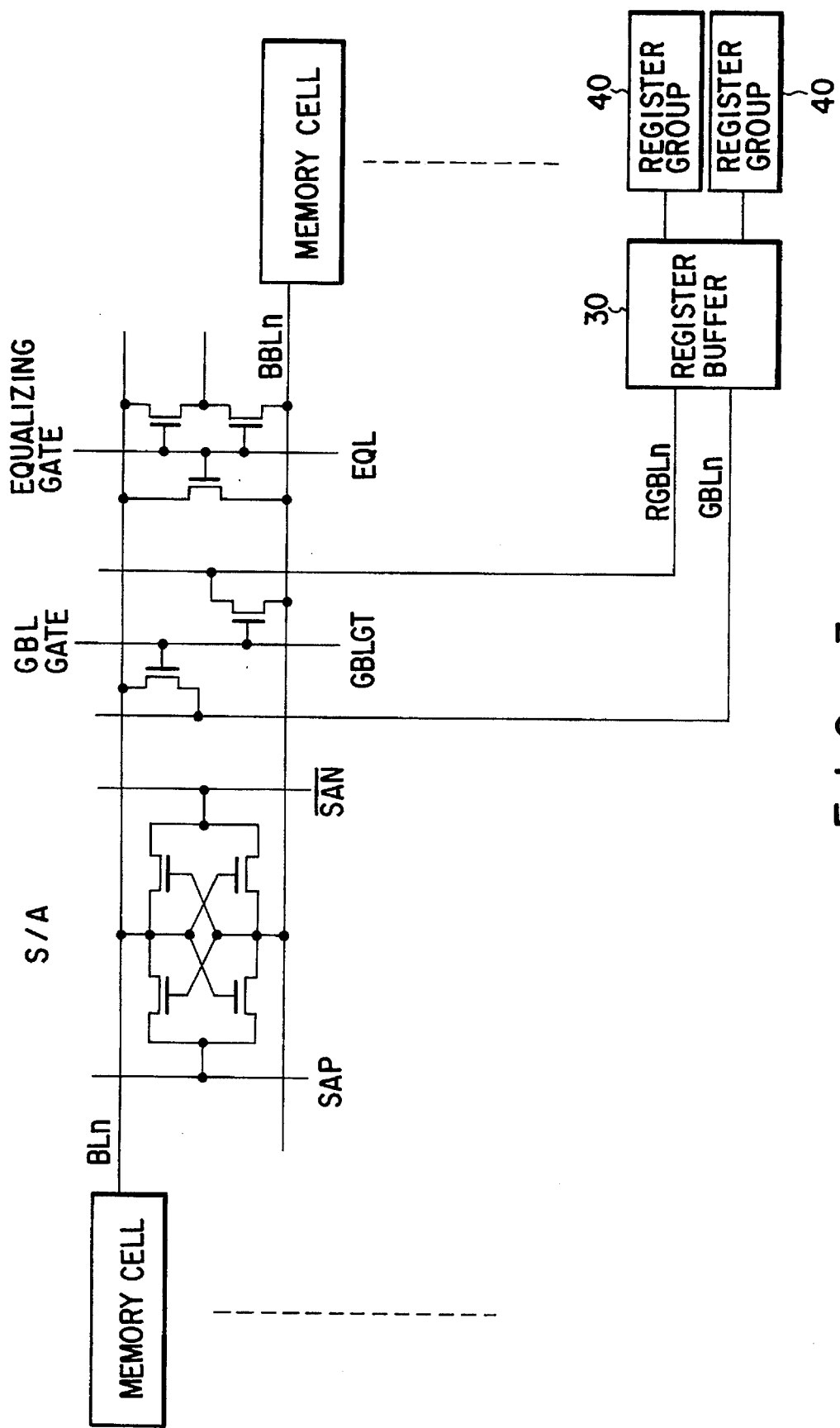
FIG. 3 shows a specific arrangement of the sense amplifier section of FIG. 1.

The plural memory cell units are, as shown in FIG. 3, connected to a single bit line BLn or BBLn. The bit lines BLn and BBLn are connected to GBLn and BGBLn, respectively, through a sense amplifier (S/A), an equalizing gate, and a GBL gate.

Figure 4:
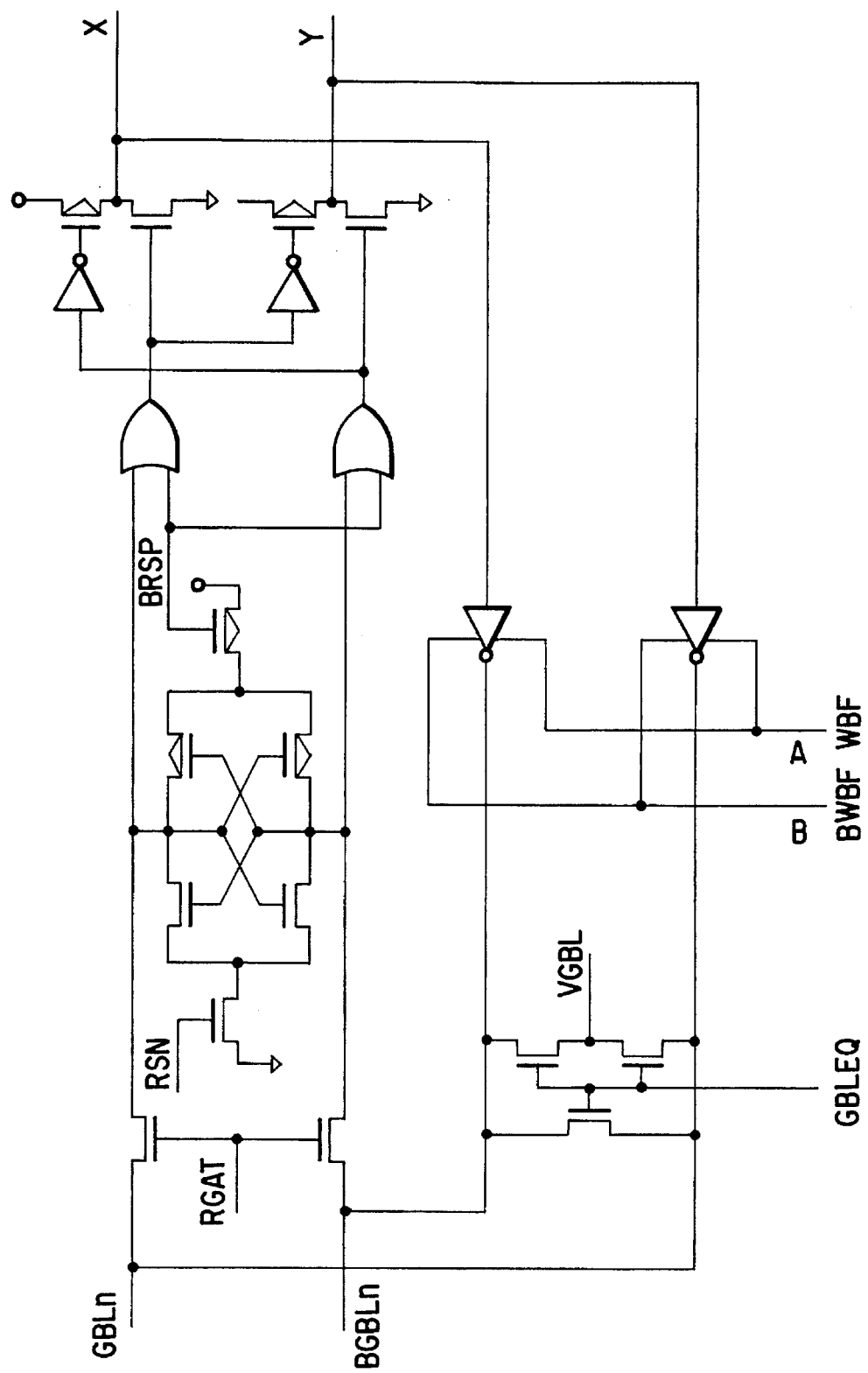
FIG. 4 shows a specific arrangement of the register buffer of FIG. 1.

The register buffer 30 is, as shown in FIG. 4, constructed to temporarily store data read out from the memory cells.

Figure 5:
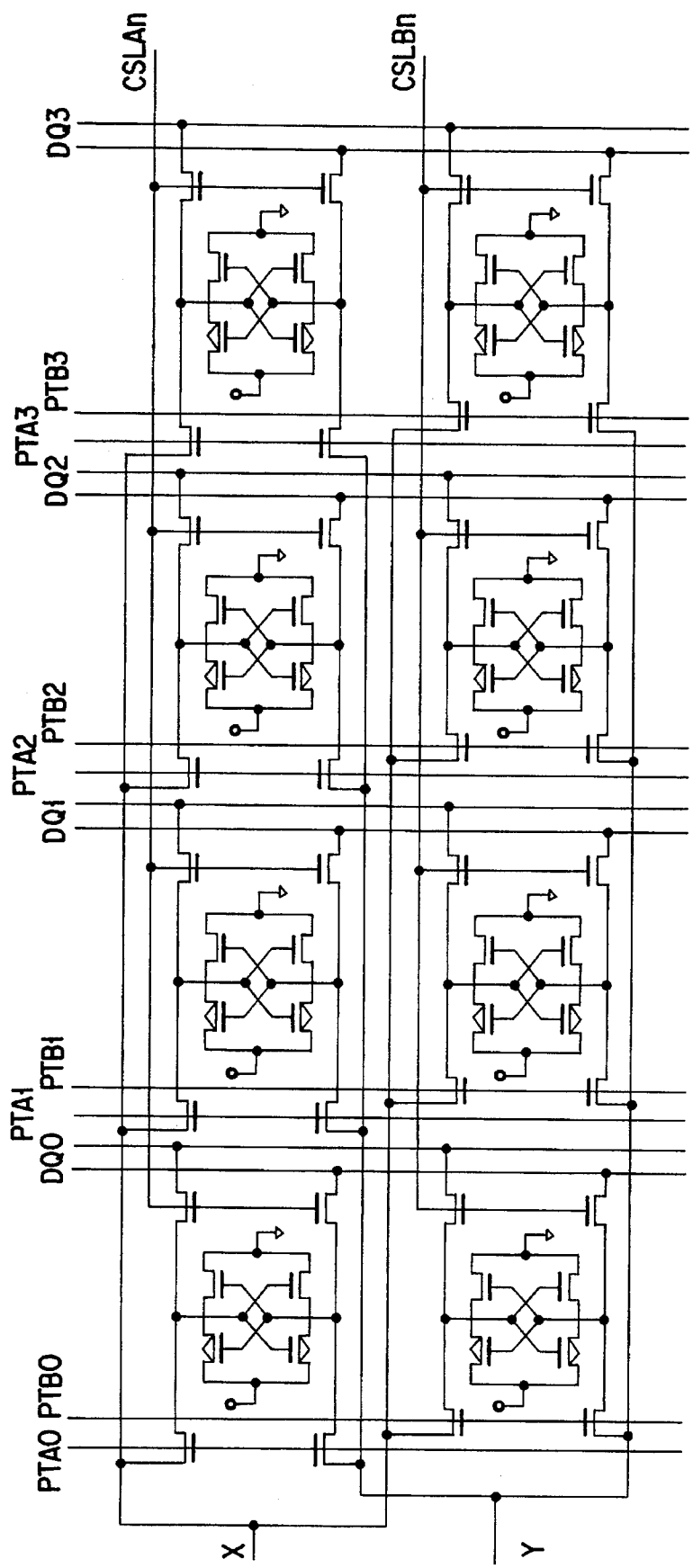
FIG. 5 shows a specific arrangement of the register group of FIG. 1.

As shown FIG. 5, the register groups 40 have eight registers (total number of A and B) which are equal in number to twice the memory cells in each memory cell unit. Two register groups 40A and 40B are prepared each of which comprises four registers which are equal in number to the cells in each memory cell unit. These register groups 40A and 40B are connected to GBLn and BGBLn through the register buffer 30. In this embodiment, although the latch-type register is used, dynamic register may be useful.

According to the above arrangement, four pieces of data stored in a memory cell unit are read and stored temporarily in the four registers in the A-block register group 40A, and data in a cell unit with another row address are read into the four registers in the B-block register group 40B while external access is made to the data in the register group 40A. This permits external access to the data in the register group 40B to be made immediately after the termination of external access to the data in the register 40A. Further, the data in the register group 40A can be rewritten into the original cell unit and data in a cell unit with another row address can be read into the register 40A while external access is made to the data in the register group 40B. This permits external access to the data in the register group 40A to be made immediately after the termination of external access to the data in the register group 40B.

When looking from outside, therefore, data transfer between the memory cell units and the register groups 40A and 40B can be hidden apparently, which helps save time. In addition, refresh operation can also be performed by the use of a register group 40B while external access is made to data in the other register group 40A, reducing the busy rate for refresh operations.

According to the device of the present invention, the provision of two register groups 40A and 40B each having as many bits as there are cells in a memory cell unit and the use of them in parallel permit read and refresh operations that were conventionally waste of time when seen from outside to be eliminated apparently. Thus, data access time can be reduced.

FIG. 6 shows an embodiment in which the register groups 40A and 40B are shared among a plurality of cell arrays. Sharing the register groups 40A and 40B among cell arrays can suppress an increase in register area in comparison with a case where a register group is provided for each memory cell array 70.

Figure 7:
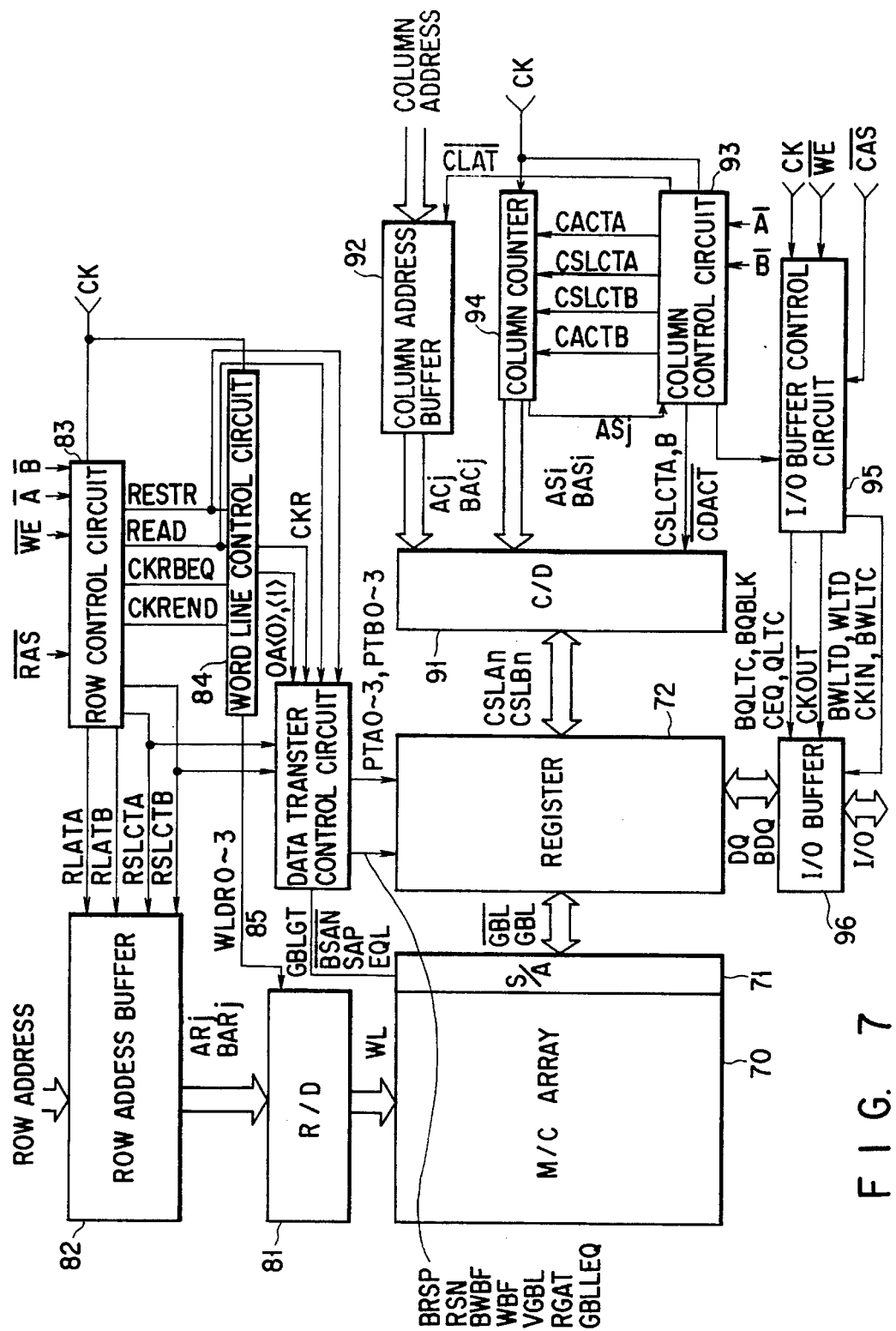
FIG. 7 is a block diagram of a system configuration.
Figure 8:
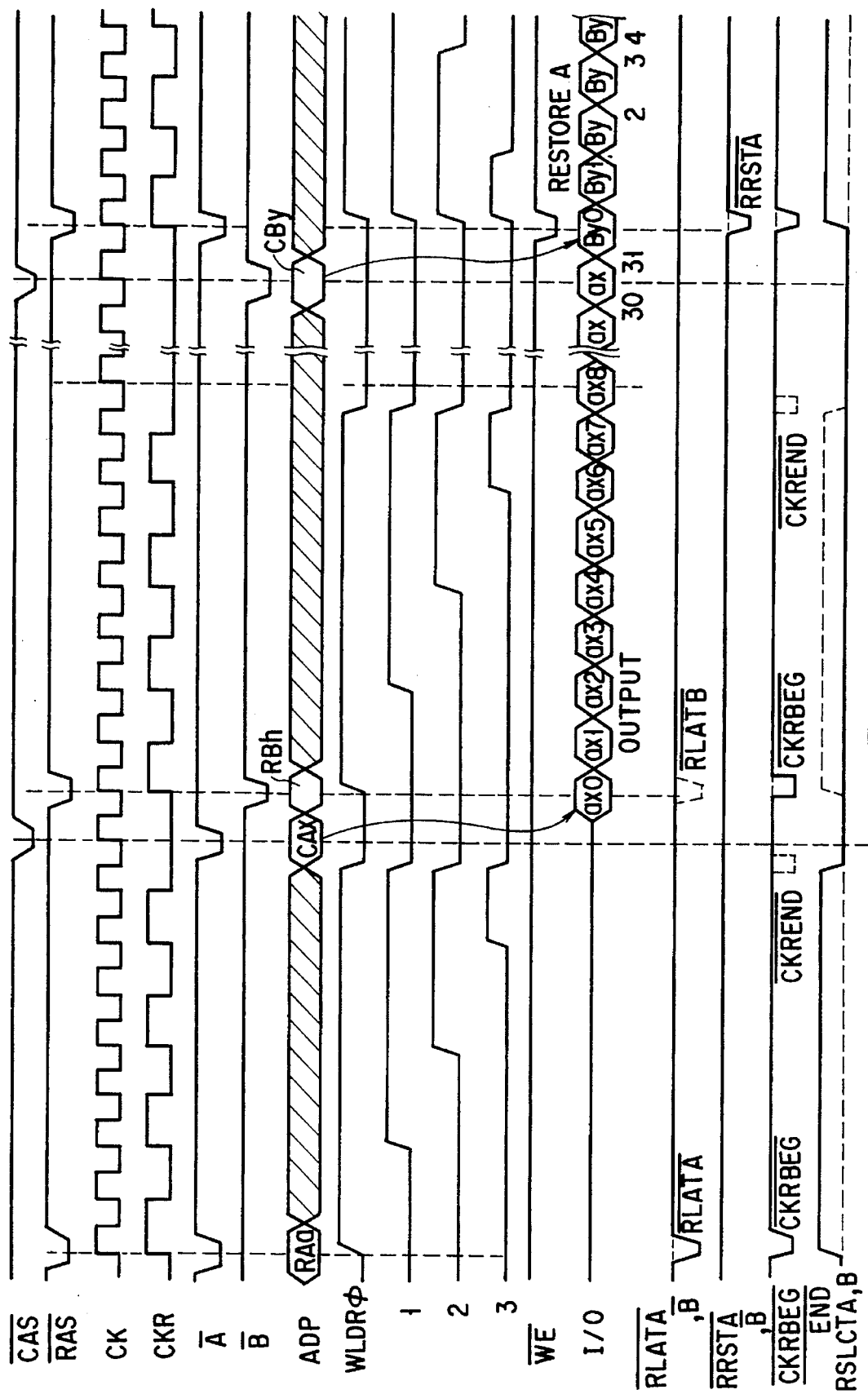
FIG. 8 shows signal waveforms of main clocks when the system of FIG. 7 is operated.
Figure 9:
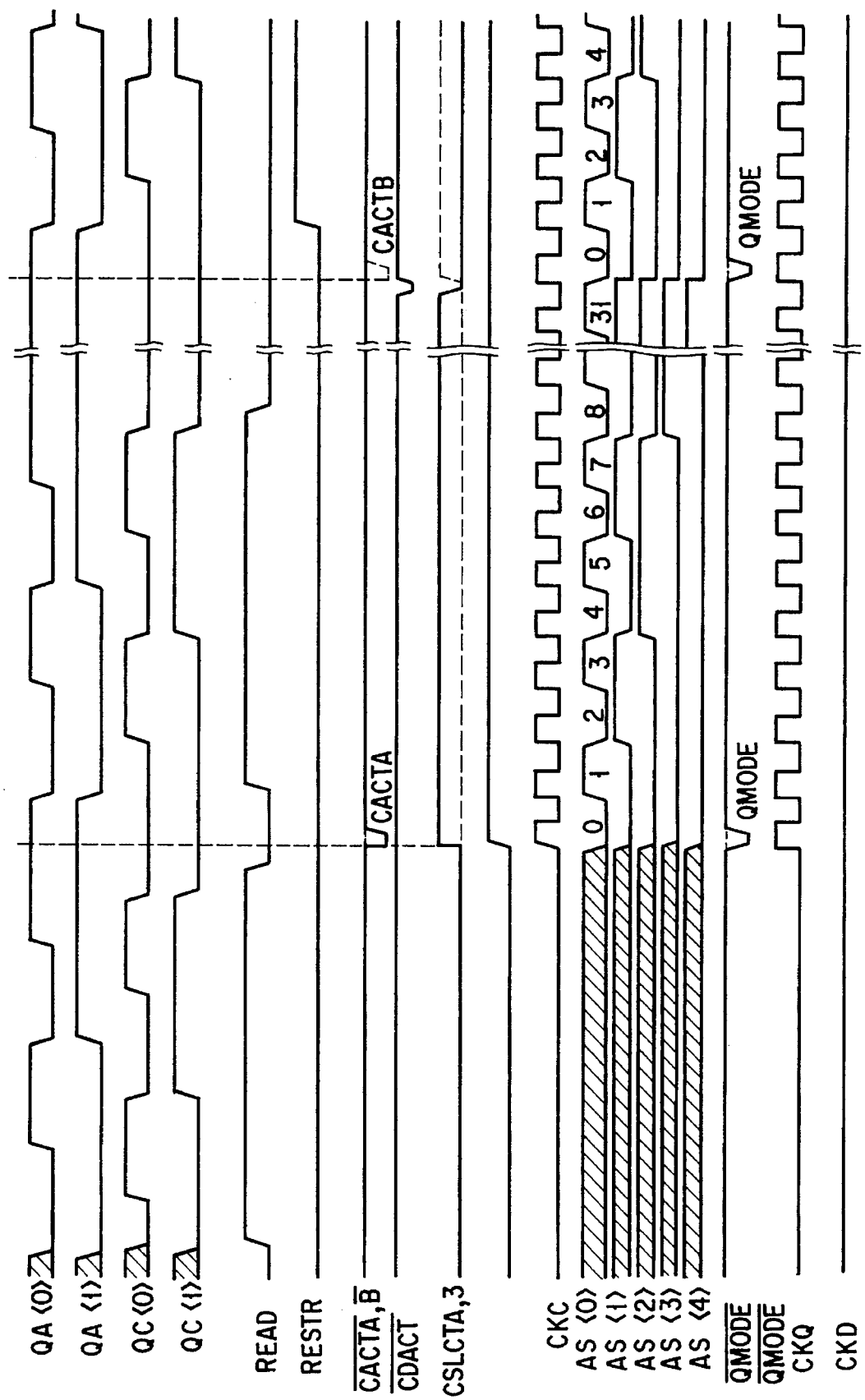
FIG. 9 shows signal waveforms of main clocks when the system of FIG. 7 is operated.
Figure 10:
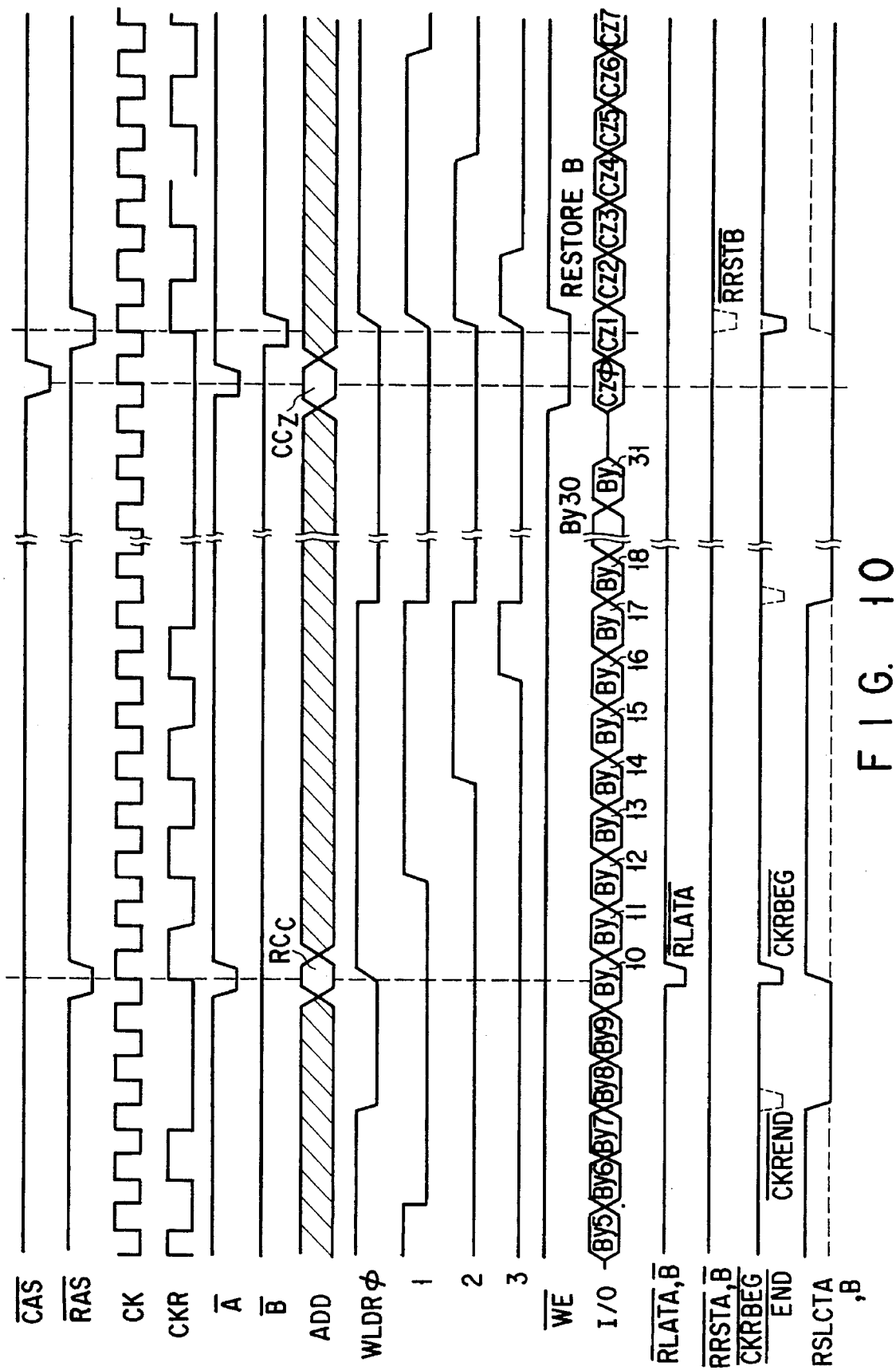
FIG. 10 shows signal waveforms of main clocks when the system of FIG. 7 is operated.

FIG. 7 shows a system configuration adapted for the circuit shown in FIG. 1.

This system comprises a memory cell (M/C) array 70, a sense amplifier (S/A) 71, a register 72, a row decoder (R/D) 81, a row address buffer 82, a row control circuit 83, a word line control circuit 84, a data transfer control circuit 85, a column decoder (C/D) 91, a column address buffer 92, a column control circuit 93, a column counter 94, an I/O buffer control circuit 95, and an I/O buffer 96.

FIGS. 8 to 11 show signal waveforms of main clocks when the system of FIG. 7 is in operation.

In FIGS. 8 to 11, internal signals are generated in synchronization with an external clock CK. External signals comprise a row address strobe /RAS, a column address strobe /CAS, signals for selecting register blocks /A and /B, an address ADD, and a write enable signal /WE. /X indicates a negation of X.

FIGS. 12A to 12E and FIGS. 13A and 13B show specific arrangements of the row control circuit 83. In FIGS. 12A to 12D, (A) to (D) correspond to circuit of (A) to (D) shown in FIG. 28 (described after), respectively.

A row address is taken, as shown in FIG. 12A, when the /RAS is low, the /A is low (when the A block is selected), the /WE is high, and the CK goes high. At this point, an address taking signal /RLATA produces a negative-going pulse. As shown in FIG. 12D, a signal /CKRBEG defining the beginning of a clock CKR for controlling a row address counter produces a negative-going pulse. As shown in FIG. 12B, a signal /RRSTA, which starts the rewriting of A-block data from the register 71 into the original cell unit, produces a negative going pulse when the /RAS is low, the /WE is low, the /A or /B is low, and the clock CK rises.

A signal /CRKEND, which defines the end of the CKR, produces a negative-going pulse when counter outputs Q<0> and Q<1> are high, and the CK and CKR are low as shown in FIG. 12C. If an A-block address is selected, a signal RSLCTA goes high while data transfers are made between a cell unit and the A-block register 72.

A signal READ goes high, as shown in FIG. 13A, while cell unit data are transferred to the register 72. A signal RESTR goes high, as shown in FIG. 13B, while data is transferred from the register 72 to a cell unit.

FIGS. 14A to 14D show a specific arrangement of the word line control circuit 84.

A signal WLDRx for controlling WLnx (x=0, 1, 2, 3) is, as shown in FIG. 14A, controlled by outputs A, B, C and D of two counters each of 2 bits and signals READ and RESTR. The counters are each constructed from a JK flip-flop (hereinafter referred to as JKFF) as shown in FIG. 14B and provide outputs as shown in FIG. 14C. A counter driving clock CKR is produced by frequency dividing the external clock CK. Although, in the present invention, the clock CK is divided by two, it may be divided by any factor. The use of counter outputs for controlling the WL permits easy control based on the CK only.

FIG. 15 shows a specific arrangement of the row address buffer 82.

Two address latch circuits are provided for the same bit of an address. An address is taken by the address latch buffer A by the signal /RLATA when data is transferred to the register group A, while, at the time of the transferring of data to the register group B, it is latched by the address latch buffer B by the signal /RLATB. The outputs of the address buffers A and B are coupled to an address select circuit for selecting an address to the row decoder 81 in response to RSLCTA and RSLCTB. The address is reset by /CKREND.

Thus, the use of two address latch buffers and an address select circuit permits rewriting of data from the register 72 into a cell unit without entry of its address.

Figure 16:
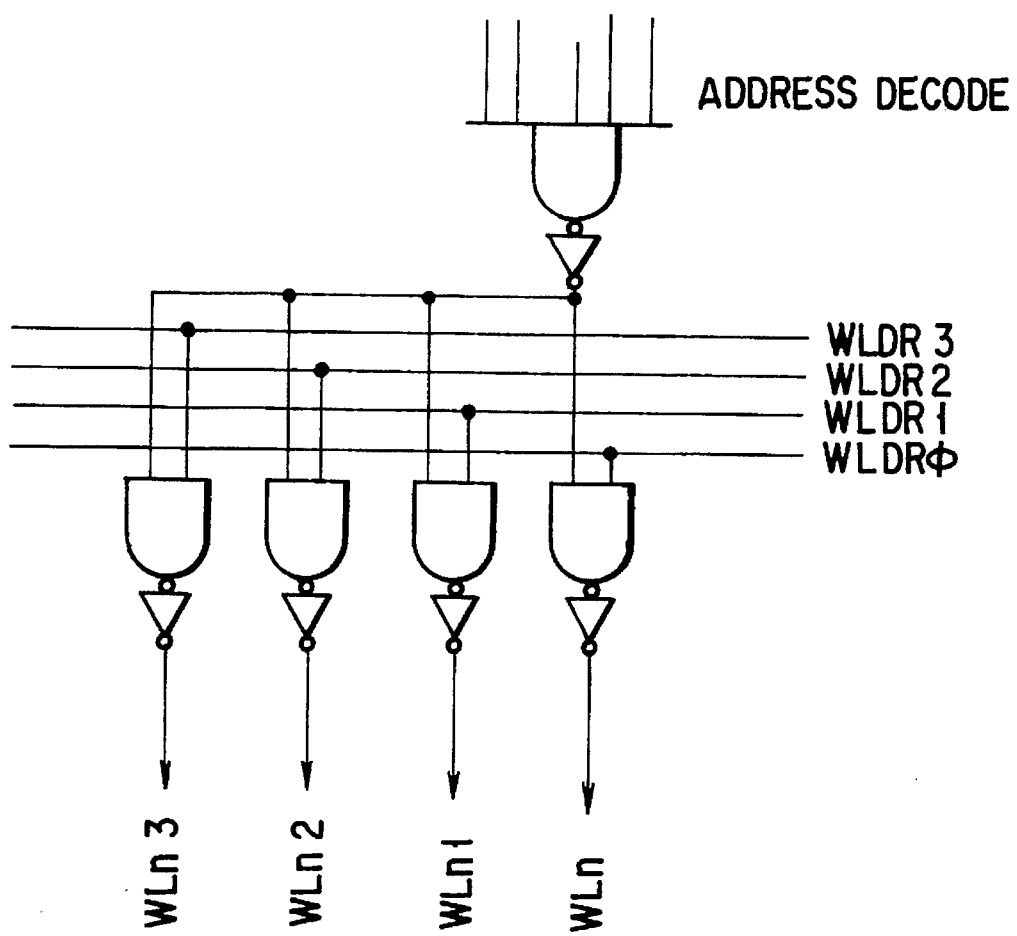
FIG. 16 shows a specific arrangement of the row decoder of FIG. 7.

FIG. 16 shows a specific arrangement of the row decoder 81. WLDR0 to WLDR3 control WLn0 to WLn3 for a cell unit designated by an address signal.

Figure 18:
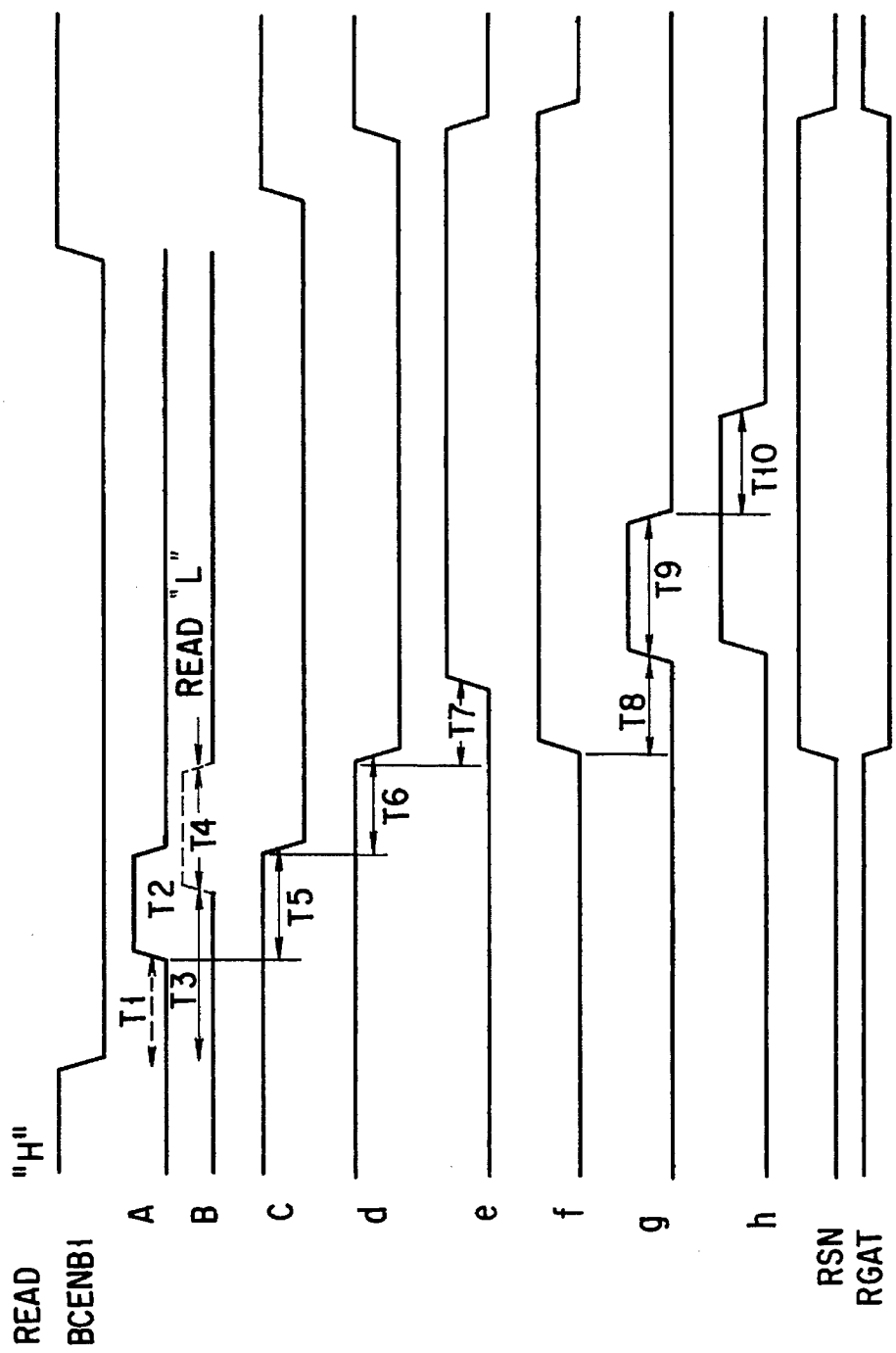
FIG. 18 shows signal waveforms at various portions of the data transfer control circuit of FIG. 7.
Figure 19:
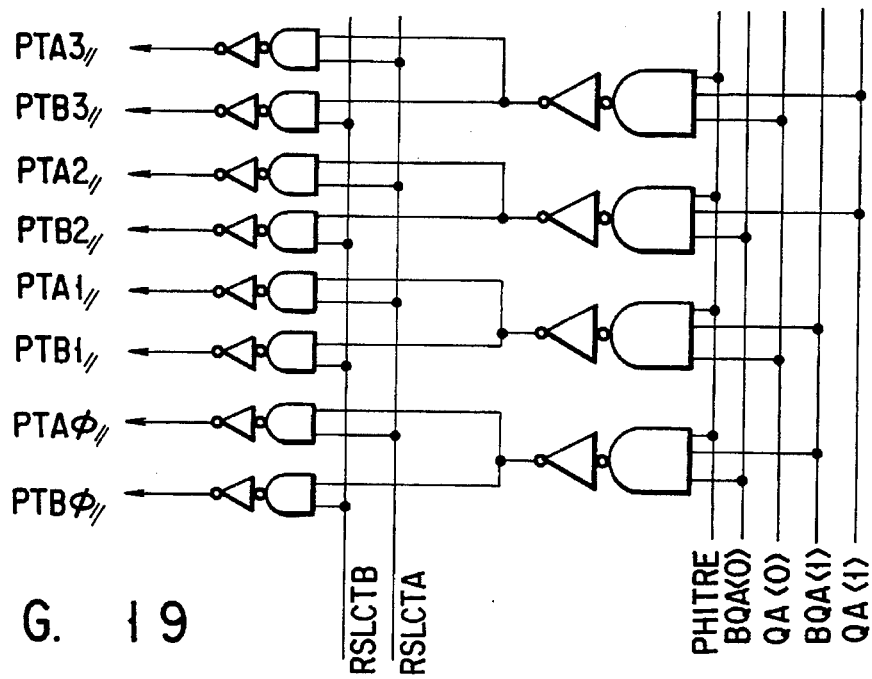
FIG. 19 shows a specific arrangement of the data transfer control circuit of FIG. 7.
Figure 20A:
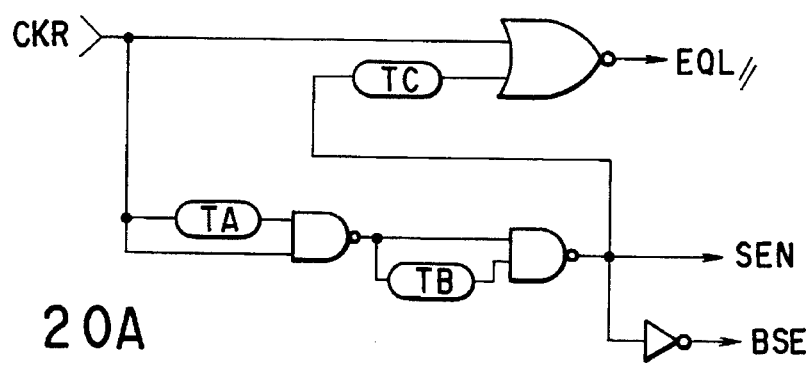
FIGS. 20A to 20C show a specific arrangement of the data transfer control circuit of FIG. 7.
Figure 20B:
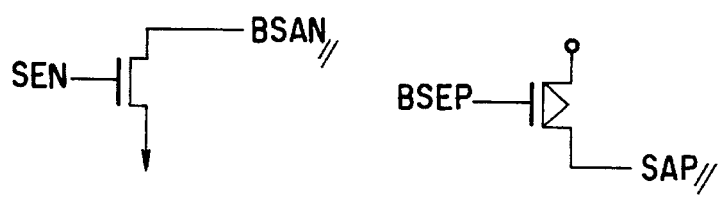
Figure 20C:
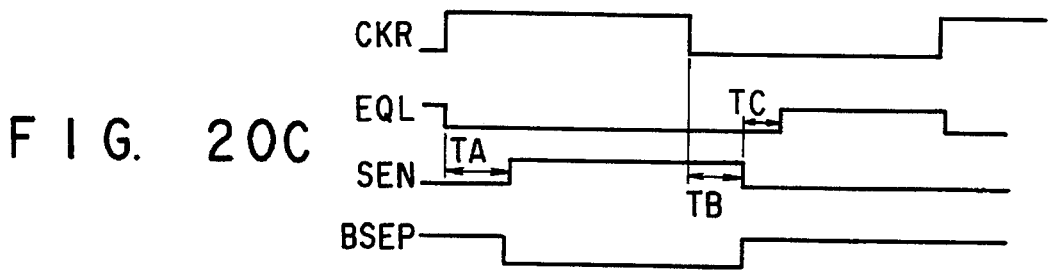

FIGS. 17 to 20C show a specific arrangement of the data transfer control circuit 85. The data transfer control circuit 85 controls signals S/A, EQL, GBLGT, GBLEQ, RGAT, RSN, BRSP, PTA0 to PTA3, TPB0 to TPB3, BWBF, and WBF during data transfer between the memory cell array 70 and the register 72. FIG. 17 shows a circuit which controls the signals GBLGT, GBLEQ, RGAT, RSN, BRSP, PHITRE, BWBF, and WBF. FIG. 18 shows signal waveforms at various portions of the data transfer control circuit 85. FIG. 19 shows a circuit controlling the signals PTA0 to PTA3, and TPB0 to TPB3. FIGS. 20A to 20C show circuits controlling the signals EQL, BSAN, and SAP, respectively.

FIGS. 21A to 21D show a specific arrangement of the column control circuit 93.

A column-system operation start signal /CACTA or /CACTB produces a negative-going pulse when the /CAS is low, the /A or /B is low, and the CK goes high as shown in FIG. 21A. A column address latch signal /CLAT produces a negative-going pulse when the /CAS is low, and the CK goes high as shown in FIG. 21B, thereby causing the column address buffer 92 to latch a column address. A signal /CDACT, which defines the end of external access to the register 72, produces a negative-going pulse when column address counter outputs As<0> to As<4> are high and the CK goes low as shown in FIG. 21C. Signals CSLCTA and CSLCTB go high during data transfer between the register group 40A and the outside and during data transfer between the register group 40B and the outside, respectively, as shown in FIG. 21D.

Figure 22A:
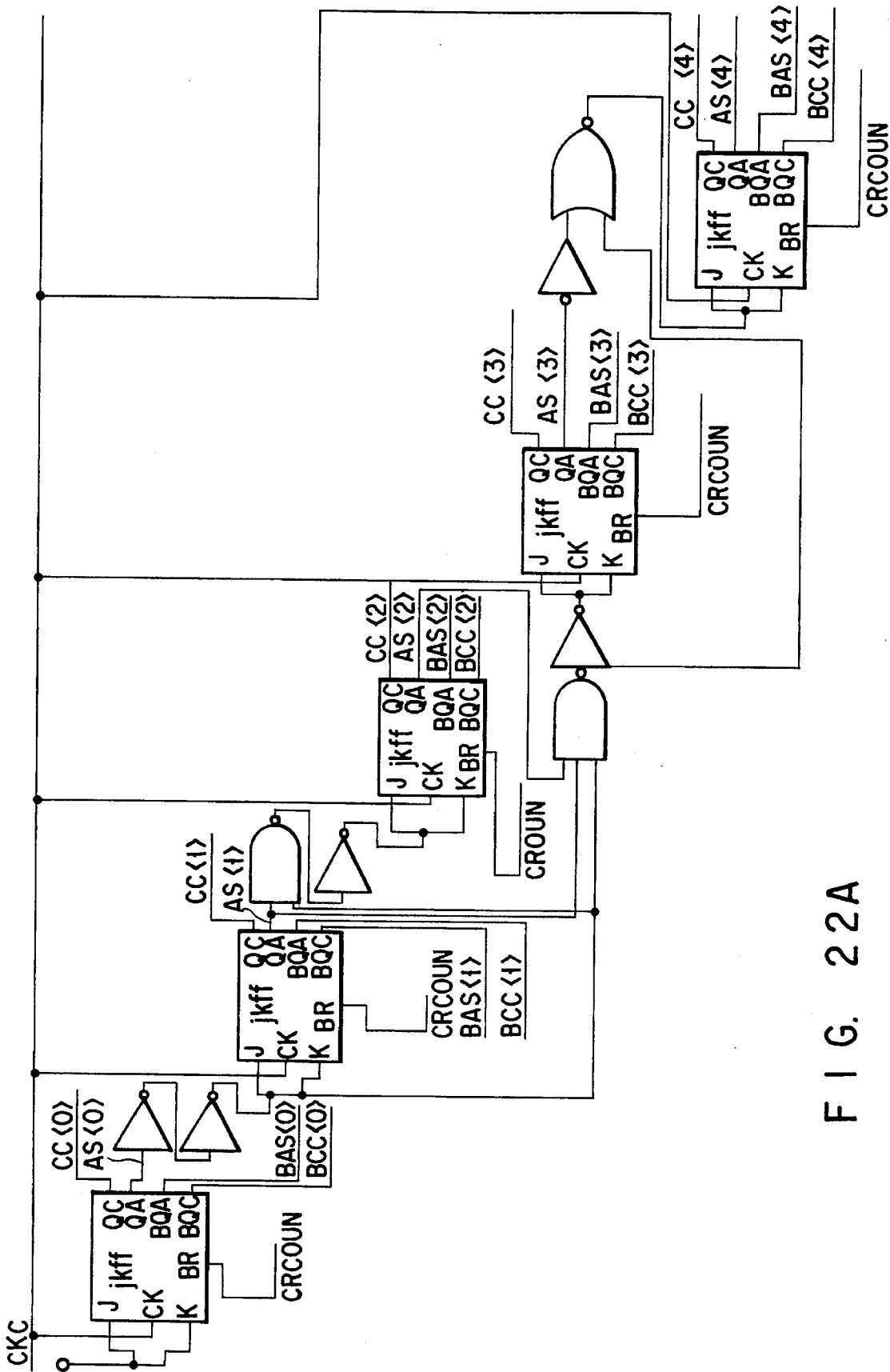
FIGS. 22A to 22C show a specific arrangement of the column counter of FIG. 7.
Figure 22B:
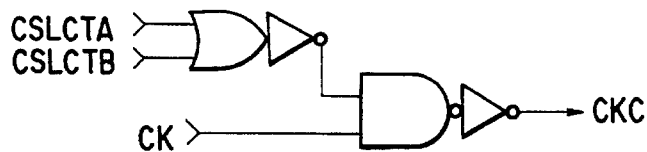
Figure 22C:

FIGS. 22A to 22C show a specific arrangement of the column counter 94.

The column counter 94 is, as shown in FIG. 22A, constructed from five JKFFs and outputs a signal for serially transferring bits, the number of which is defined by the counter (in this case, $2^5=32$ bits), in a group after a column address has been input. The signals CKC and CRCOUN are produced by the circuits shown in FIGS. 22B and 22C. When multiple bits are thus read serially from one register 72 in response to a single access operation, data transfer is permitted between a memory cell unit and the other register 72 (not shown). This can conceal the time taken to transfer data between the register 72 and a memory cell unit.

Figure 23:
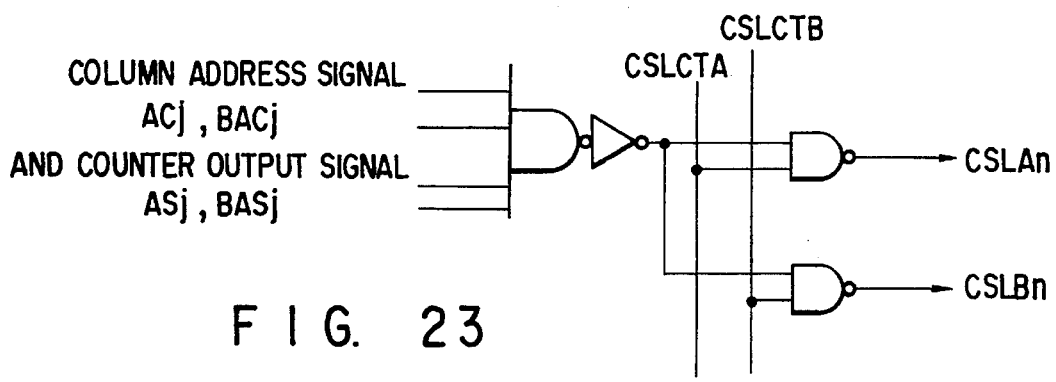
FIG. 23 shows a specific arrangement of the column decoder (C/D) of FIG. 7.
Figure 24A:
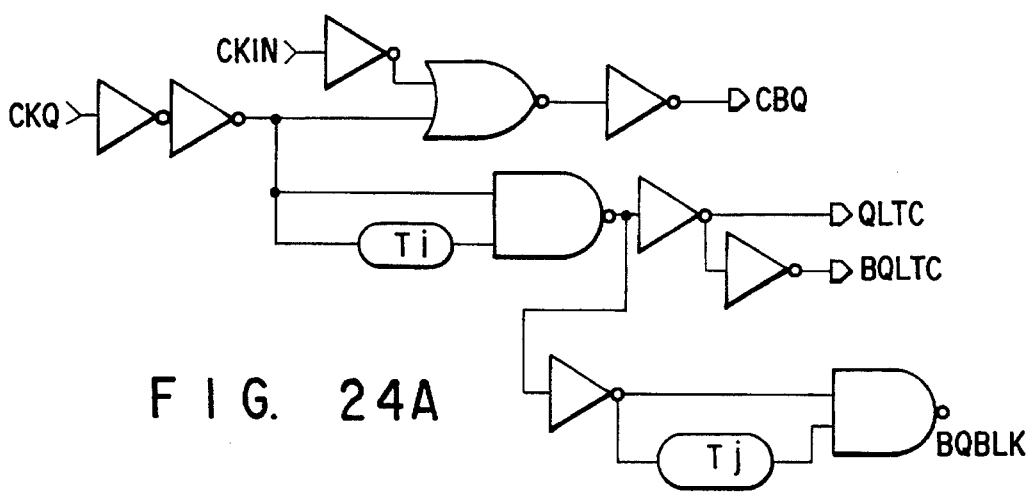
FIGS. 24A and 24B show a specific arrangement of the I/O buffer control circuit of FIG. 7.
Figure 24B:
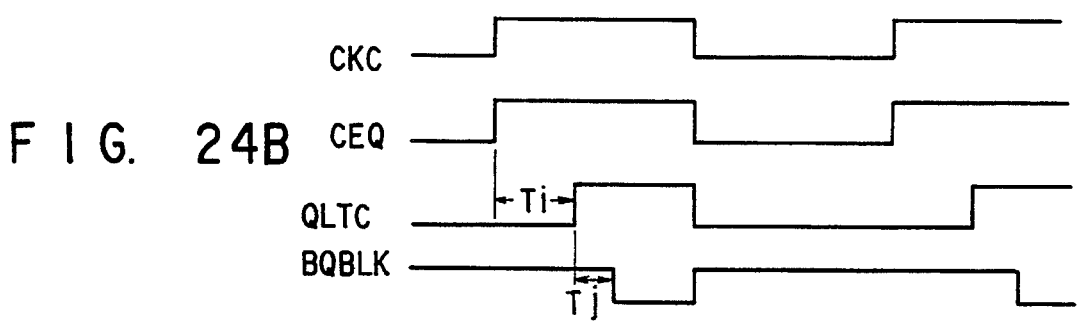

FIG. 23 shows a specific arrangement of the C/D 91. The C/D 91 decodes an input column address on the basis of signals of the column counter 94 and outputs a signal CSLAn or CSLBn in response to the A-block or B-block select signal CLCTA or CSLCTB.

FIGS. 24A to 26C show a specific arrangement of the I/O buffer control circuit 95. The circuit shown in FIG. 24A produces signals CBQ, QLTC, BQLTC, and BQBLK. FIG. 24B is a timing diagram illustrating a relationship among CKC, CEQ, QLTC and BQBLK. As shown in FIG. 25A, /DMODE and /QMODE are signals which define access when a column address is input as a write mode and a read mode, respectively. The/DMODE produces a negative-going pulse when the /CAS and /WE are low and the CK goes high, while the /QMODE produces a negative-going pulse when the /CAS is low, the /WE is high, and the CK goes high.

CKD is, as shown in FIG. 25B, a data inputting clock. Data is taken at a positive-going edge of the CK and written into the register 72 at the next negative-going edge of the CK. CKQ is a data transfer clock. CKOUT is a clock for controlling a data output buffer. Data is output at a negative-going edge of the CKOUT. The width of the CKOUT pulse is set so that an external CPU can receive output data. FIG. 25C shows waveforms of the CKQ and CKOUT and output waveforms at intermediate portions a and b of the circuit of FIG. 25B.

As shown in FIG. 26A, BWLTC and CKIN are obtained from the CKD. As shown in FIG. 26B, WLTD and BMLTD are obtained from the BWLTC. These signal waveforms are illustrated in FIG. 26C.

Figure 27:
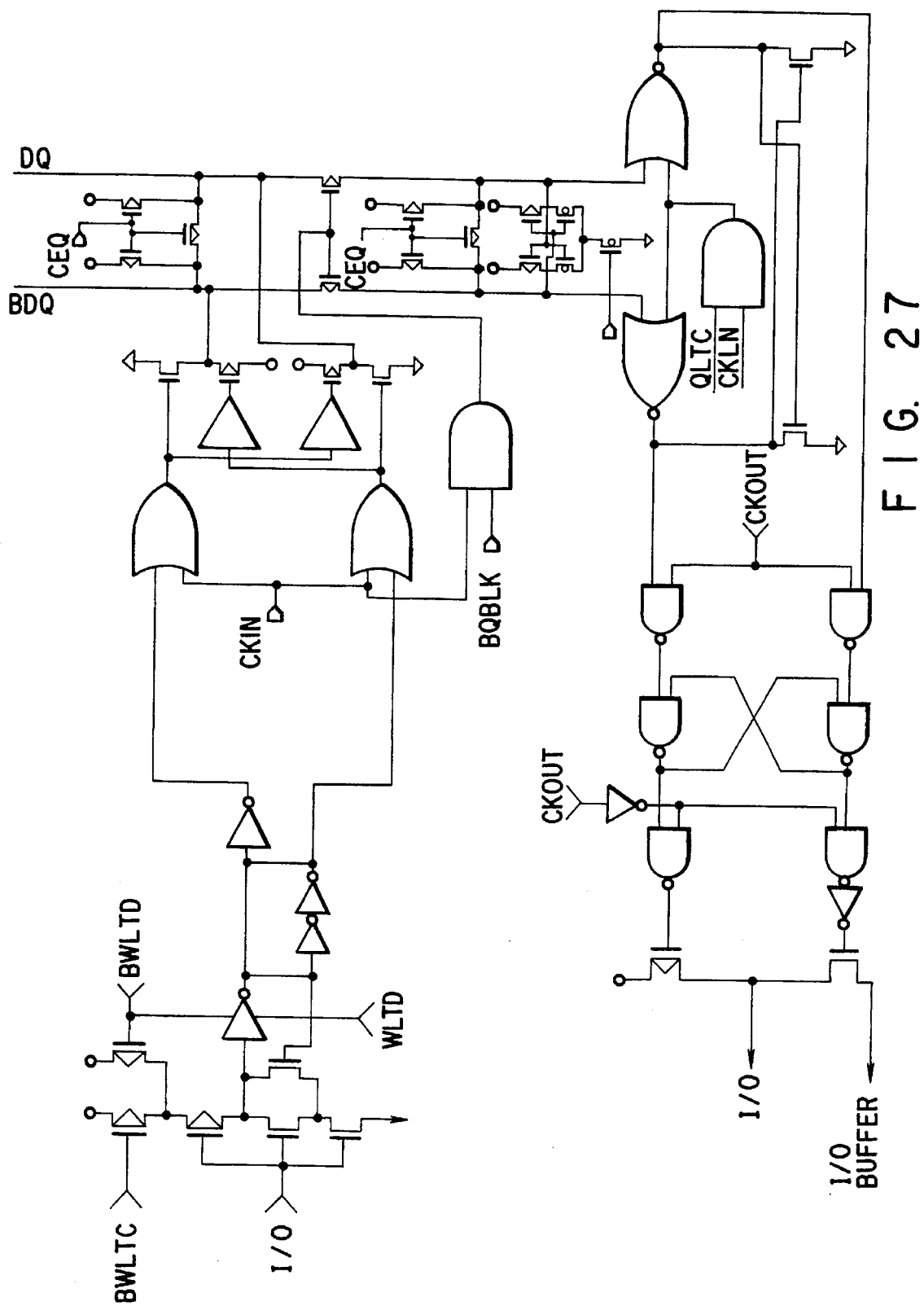
FIG. 27 shows a specific arrangement of the I/O buffer of FIG. 7.

FIG. 27 shows a specific arrangement of the I/O buffer 96. In a read mode, data output onto BD and DQ is latched at a positive-going edge of QLTC and then output when the CKOUT goes low. Next data is output to the DQ and BDQ when the CK goes high while the CKOUT remains low, preparing for next data outputting.

Figure 29:
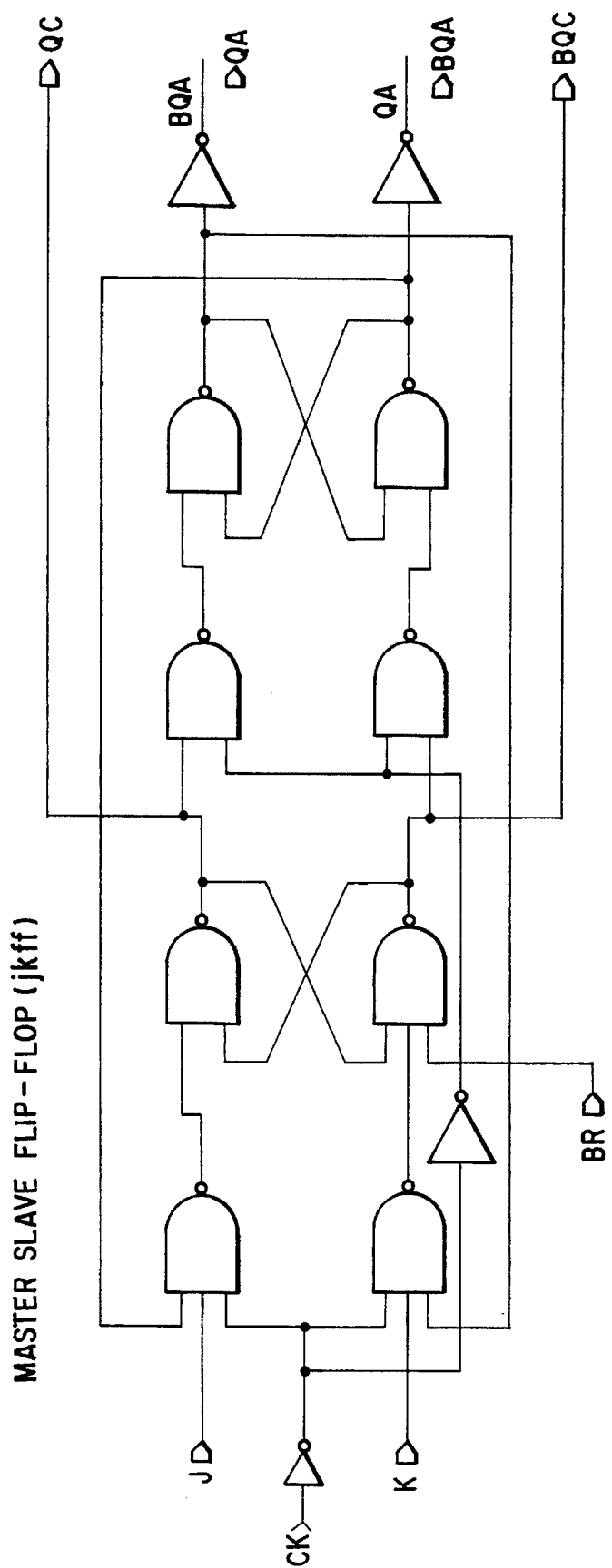
FIG. 29 shows a specific arrangement of a JK flip-flop used in the embodiment of the present invention.

FIGS. 28A to 28D illustrate examples of basic pulse generating circuits (A) to (D) used in the present embodiment. FIG. 29 shows a circuit arrangement of the JKFF used in the present embodiment. The JKFF is not special at all but is the same as ones used conventionally. Any other device having the same function can be used.

Although specific arrangements of various portions and signal waveforms have been shown, they are illustrative only and not restrictive. In the above embodiment, use is made of two register groups each of which is adapted to temporarily store data stored in a single memory cell unit. Alternatively, three or more register groups may be used so as to permit an access time seen from outside to be further reduced. The present invention can be modified in various ways without departing from the spirit of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   at least one memory cell array having a plurality of memory cell units each comprising a plurality of MOS transistors connected in series and a plurality of data storage capacitors each connected at one end to a source of a corresponding one of said MOS transistors; and
   a plurality of register groups provided for each column of each of said memory cell units, each of said register groups having the same number of registers as the number of memory cells in one memory cell unit, one of said register groups of each column temporarily storing data stored in one of said memory cell unit of said column when data-reading/-writing of another register groups is executed for another memory cell unit.

2. A semiconductor memory device according to claim 1, wherein each of said memory cell units is a NAND structure.

3. A semiconductor memory device according to claim 1, wherein each of said register groups is composed of static memory cells.

4. A semiconductor memory device according to claim 3, wherein there are a plurality of memory cell arrays, and at least part of said register groups is shared among said plurality of memory cell arrays.

5. A semiconductor memory device according to claim 1, further comprising a plurality of address latch circuits provided for each address bit of said memory cell array for latching addresses for address bits of said memory cell array input from an external device of said semiconductor memory device.

6. A semiconductor memory device according to claim 5, further comprising an address select circuit for selecting one of said address latch circuit.

7. A semiconductor memory device according to claim 5, wherein said address latch circuits include means for latching row addresses.

8. A semiconductor memory device according to claim 7, further comprising an address select circuit for selecting one of row addresses output from said address latch circuits.

9. A semiconductor memory device according to claim 1, further comprising a word line extending over said memory cell units and a control circuit for outputting a control signal to control said word line, said control circuit including a counter.

10. A semiconductor memory device comprising:
    at least one memory cell array having a plurality of memory cell units and a plurality of bit lines, each of said memory cell units having a plurality of memory cells and each of said bit lines being connected to a plurality of said memory cell units;
    at least two register groups provided for each of said memory cell units and connected to said memory cell units via one of said bit lines, each of said register groups having the same number of registers as the number of memory cells in one memory cell unit; and
    control means for activating said register groups independently.

11. A semiconductor memory device according to claim 10, wherein each of said memory cell units is a NAND structure.

12. A semiconductor memory device according to claim 10, wherein each of said register groups is composed of static memory cells.

13. A semiconductor memory device according to claim 12, wherein there are a plurality of memory cell arrays, and at least part of said register groups is shared among said plurality of memory cell arrays.

14. A semiconductor memory device according to claim 10, further comprising a plurality of address latch circuits provided for each address bit of said memory cell array for latching addresses for address bits of said memory cell array input from an external device of said semiconductor memory device.

15. A semiconductor memory device according to claim 14, further comprising an address select circuit for selecting one of said address latch circuit.

16. A semiconductor memory device according to claim 14, wherein said address latch circuits include means for latching row addresses.

17. A semiconductor memory device according to claim 16, further comprising an address select circuit for selecting one of row addresses output from said address latch circuits.

18. A semiconductor memory device according to claim 10, further comprising a word line extending over said memory cell units and a control circuit for outputting a control signal to control said word line, said control circuit including a counter.

* * * * *